US007774152B2

(12) United States Patent
Hamamoto

(10) Patent No.: US 7,774,152 B2
(45) Date of Patent: Aug. 10, 2010

(54) METHOD OF MANUFACTURING IMAGE DISPLAY APPARATUS

(75) Inventor: Yasuhiro Hamamoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1259 days.

(21) Appl. No.: 11/275,357

(22) Filed: Dec. 28, 2005

(65) Prior Publication Data

US 2006/0158445 A1 Jul. 20, 2006

(30) Foreign Application Priority Data

Jan. 6, 2005 (JP) ............................ 2005-001529
Dec. 20, 2005 (JP) ............................ 2005-366555

(51) Int. Cl.
*G01R 19/00* (2006.01)

(52) U.S. Cl. ........................... 702/64; 702/94; 702/107; 702/117; 445/24; 445/63; 445/66; 345/55; 324/770; 313/172; 65/155; 65/158

(58) Field of Classification Search .................. 65/155, 65/158; 313/495, 169, 172; 324/770; 345/74.1, 345/55; 445/24, 63, 66; 702/64, 94, 95, 702/107, 117

See application file for complete search history.

(56) References Cited

U.S. PATENT DOCUMENTS 4,826,727 A 5/1989 Glaser ........................ 428/403
5,847,495 A 12/1998 Yamanobe et al. .......... 313/310
6,147,449 A 11/2000 Iwasaki et al. .............. 313/495
6,169,356 B1 1/2001 Ohnishi et al. .............. 313/495
6,171,162 B1 1/2001 Iwasaki et al. ................. 445/6
6,179,678 B1 1/2001 Kishi et al. .................... 445/24
6,246,168 B1 6/2001 Kishi et al. ................. 313/495
6,259,422 B1 7/2001 Hamamoto ................ 345/74.1
6,334,801 B1 1/2002 Kawade et al. ................ 445/24
6,344,711 B1 2/2002 Ohnishi et al. .............. 313/495
6,384,541 B1 5/2002 Ohnishi et al. ........... 315/169.3
6,409,563 B1 6/2002 Tamura et al. ................. 445/3

(Continued)

FOREIGN PATENT DOCUMENTS

JP 3-87847 4/1991

(Continued)

*Primary Examiner*—Eliseo Ramos Feliciano
*Assistant Examiner*—Elias Desta
(74) *Attorney, Agent, or Firm*—Fitzpatrick, Cella, Harper & Scinto

(57) ABSTRACT

A method of calculating node potentials in a network including current flow nodes on wirings with high precision at high speed is provided. Provided are a drive method of making voltages applied to electron-emitting devices uniform using the calculating method and an apparatus for manufacturing an image display apparatus including the electron-emitting devices. Assume that n nodes are located between one end of a wiring in which a potential $D_L$ is set and the other end of the wiring in which a potential $D_R$ is set. At a j-th node counted from the one end, when a current value flowing therefrom is $I_j$, a node potential is $V_j$, resistance elements between a terminal and a node and between adjacent nodes are $R_0$ to $R_{n+1}$, and a resistance between both end of the wiring is $R_{all}$, the node potential $V_j$ is calculated by the following expression.

$$V_j = D_L\frac{1}{R_{all}}\sum_{q=j}^{n} R_q + D_R\frac{1}{R_{all}}\sum_{p=0}^{j-1} R_p - \sum_{k=1}^{n}\left(\frac{1}{R_{all}}\sum_{p=0}^{min(j,k)-1} R_p \sum_{q=max(j,k)}^{n} R_q\right) I_k$$

16 Claims, 13 Drawing Sheets

U.S. PATENT DOCUMENTS

| | | | | |
|---|---|---|---|---|
| 6,473,063 | B1 | 10/2002 | Suzuki et al. | 345/74.1 |
| 6,608,437 | B1 | 8/2003 | Kishi et al. | 313/495 |
| 6,626,719 | B2 | 9/2003 | Ono et al. | 445/24 |
| 6,760,002 | B2 | 7/2004 | Suzuki et al. | 345/74.1 |
| 6,802,752 | B1 | 10/2004 | Ohnishi et al. | 445/6 |
| 6,831,401 | B1 | 12/2004 | Yamamoto et al. | 313/495 |
| 6,876,156 | B1 | 4/2005 | Yamamoto et al. | 315/169.3 |
| 6,890,231 | B2 | 5/2005 | Ohnishi et al. | 445/6 |
| 6,908,356 | B2 | 6/2005 | Ohnishi et al. | 445/50 |
| 6,992,428 | B2 | 1/2006 | Kyogaku et al. | 313/310 |
| 7,034,444 | B2 * | 4/2006 | Tsukamoto | 313/309 |
| 7,057,336 | B2 | 6/2006 | Kishi et al. | 313/495 |
| 7,157,850 | B2 * | 1/2007 | Miyazaki et al. | 313/495 |
| 7,180,514 | B2 * | 2/2007 | Kuno et al. | 345/211 |
| 2005/0035703 | A1 | 2/2005 | Yamamoto et al. | 313/495 |
| 2005/0040751 | A1 | 2/2005 | Yamamoto et al. | 313/311 |
| 2005/0059185 | A1 * | 3/2005 | Yuki et al. | 438/48 |
| 2005/0151703 | A1 | 7/2005 | Ohnishi et al. | 345/55 |
| 2006/0189243 | A1 | 8/2006 | Kishi et al. | 445/24 |

FOREIGN PATENT DOCUMENTS

| | | |
|---|---|---|
| JP | 7-235255 | 9/1995 |
| JP | 2000-243223 | 9/2000 |
| JP | 2000-243292 | 9/2000 |

* cited by examiner

METHOD OF MANUFACTURING IMAGE DISPLAY APPARATUS

BACKGROUND OF THE INVENTION

1. Field of the Invention

The present invention relates to a method of manufacturing an image display apparatus.

2. Related Background Art

A display having an electron source substrate in which a plurality of field emission electron-emitting devices (hereinafter referred to as FEDs) or a plurality of surface conduction electron-emitters (hereinafter referred to as SCEs) are arranged in matrix corresponding to phosphors for respective pixels is provided as a planer self-light-emission type image display apparatus.

As disclosed in Japanese Patent Application Laid-Open No. H07-235255, the SCE can be subjected to an "activation process" to improve electron emission characteristics. The "activation process" is performed by repeatedly applying a pulse voltage to an electron-emitting region in an atmosphere in which an activation material containing, for example, carbon or a carbon compound is supplied to the electron-emitting region.

As disclosed in Japanese Patent Application Laid-Open No. 2000-243223, the FED and the SCE can be subjected to a "preparative driving process" to improve the stability of electron emission characteristics. The "preparative driving process" is a driving method of driving the electron-emitting device at a voltage V1 determined from a predetermined relational expression and then performing normal driving at a voltage V2 of a voltage range determined from a predetermined relational expression.

A manufacturing method and a manufacturing apparatus for performing the "activation process" on an electron source substrate in which the SCEs are arranged in matrix are disclosed in, for example, Japanese Patent No. 3087847.

In Japanese Patent No. 3087847, an energization operation of the "activation process" is performed on an electron source in which the plurality of electron-emitting devices are connected to one another through a common wiring by simultaneously applying a voltage to each of the plurality of electron-emitting devices through the common wiring. Japanese Patent No. 3087847 shows that a voltage effectively applied to each of the electron-emitting devices is deviated from a desirable value by voltage drop caused by wiring resistance. As disclosed in Japanese Patent No. 3087847, a current If flowing through each of the electron-emitting devices or a current flowing through the wiring connected to the respective electron-emitting devices is measured and the voltage drop caused by wiring resistance is compensated based on the measured current value to apply a voltage to each of the electron-emitting devices or the wiring connected to the respective electron-emitting devices.

A manufacturing method and a manufacturing apparatus for performing the "preparative driving process" on an electron source substrate in which the electron-emitting devices are arranged in matrix are disclosed in, for example, Japanese Patent Application Laid-Open No. 2000-243292. In Japanese Patent Application Laid-Open No. 2000-243292, an energization operation of the "preparative driving process" is performed on an electron source in which the plurality of electron-emitting devices are connected to one another through a common wiring by simultaneously applying a voltage to each of the plurality of electron-emitting devices through the common wiring.

When the electron source including the plurality of electron-emitting devices is applied to an image display apparatus such as a flat panel display, the uniformity among electron emission characteristics of the respective electron-emitting devices is required in order to ensure the uniformity of a display image. Therefore, a method of realizing a desirable electron emission characteristic with high repeatability is demanded to manufacture the electron-emitting device. In addition, a method of minimizing an electron emission characteristic difference among the electron-emitting devices is demanded to manufacture the electron source including the plurality of electron-emitting devices arranged on the same substrate.

In addition to the electron-emitting device such as the surface conduction electron-emitter, for example, an EL device can be provided as an image display device. An arrangement in which a light emitting layer of an electroluminescent display is formed by the application of a voltage is disclosed in U.S. Pat. No. 4,826,727.

In order to improve the display performance of the image display apparatus, it is necessary to improve the uniformity among characteristics of the image display devices. More specifically, in the case of the image display apparatus using the electron-emitting devices as the image display devices, it is necessary to realize the uniformity among the electron emission characteristics of the respective electron-emitting devices of the electron source. When the uniformity among the electron emission characteristics is to be realized, it is useful that voltage values effectively applied to the electron-emitting region are more uniformed in the activation process and the preparative driving process.

When the activation process and the preparative driving process are to be performed on an electron source in which a large number of electron-emitting devices are connected in matrix or an image display apparatus including the electron source, it is necessary to simultaneously select a plurality of electron-emitting devices to apply a voltage to each of the devices at the request of shortening a process time. When the voltage is simultaneously applied to each of the plurality of electron-emitting devices, the voltage drop caused by wiring resistance becomes significant, so that a difference among wiring potentials (node potentials) in node positions in which the respective electron-emitting devices are arranged cannot be neglected. A shape of a distribution of the node potentials is not limited to a constant shape and thus is changed according to current values flowing thorough the respective electron-emitting devices. Therefore, in order to apply a uniform voltage to each of the electron-emitting devices, it is necessary to predict a voltage drop quantity with high precision to add a compensation voltage to a terminal voltage. In order to shorten the process time, it is necessary to complete calculation for predicting the voltage drop quantity at short times.

The above-mentioned requirements are made for the formation of the EL device which is caused by the application of a voltage.

SUMMARY OF THE INVENTION

An object of the present invention is to provide a method of manufacturing an image display apparatus using image display devices such as electron-emitting devices or EL devices, in which potentials can be adequately estimated. More specifically, there are provided a method of calculating node potentials in a network in which current flow nodes are provided in wirings and a matrix network with high precision at high speed and a drive method of applying a uniform voltage to each of a plurality of nonlinear devices connected in matrix. In particular, there are provided a drive method of making voltages applied to the respective electron-emitting devices uniform during an activation process and a preparative driving process in an electron source and image display apparatus manufacturing method including the activation process and the preparative driving process and a manufacturing apparatus realizing the drive method.

According to one aspect of the present invention, there is provided a method of manufacturing an image display apparatus including at least one first wiring, a plurality of image display devices connected to the first wiring, and a plurality of second wirings connected to the plurality of image display devices, including the steps of:

determining a signal applied to the second wirings; and applying a voltage to portions connected to the first wiring and the second wirings by application of a potential $D_L$ to a first predetermined position of the first wiring, application of a potential $D_R$ to a second predetermined position thereof, and application of the signal to the plurality of second wirings, in which the determining step includes a step of setting a set value $V_j$ associated with a j-th position of a plurality of n positions (where j and n each are a positive integer) located between the first predetermined position and the second predetermined position on the first wiring, in which in the setting step, the set value $V_j$ is set by the following expression:

$$V_j = D_L a_j + D_R b_j - \sum_{k=1}^{n} c_{j,k} I_k$$

where $I_k$ denotes a current quantity flowing from a k-th position of the n positions, in which when a resistance between the j-th position and a (j+1)-th position on the first wiring is $R_j$, a resistance between a first position and one of the first predetermined position and the second predetermined position which is closer to the first position is $R_0$, a resistance between an n-th position and one of the first predetermined position and the second predetermined position which is closer to the n-th position is $R_n$, and a resistance between the first predetermined position and the second predetermined position is $R_{all}$, $a_j$, $b_j$, and $C_{j,k}$ are expressed by:

$$a_j = \frac{1}{R_{all}} \sum_{q=j}^{n} R_q$$

$$b_j = \frac{1}{R_{all}} \sum_{p=0}^{j-1} R_p$$

$$c_{j,k} = \frac{1}{R_{all}} \sum_{p=0}^{min(j,k)-1} R_p \sum_{q=max(j,k)}^{n} R_q$$

in which the setting step includes a step of setting the current quantity $I_k$ based on a result obtained by measurement of currents flowing through the second wirings, and in which the determining step includes a step of determining the signal applied to the second wirings based on the set value $V_j$.

Here, in the step of applying the voltage to the portions connected to the first wiring and the second wirings, the portions to which the voltage is applied are portions provided as the image display devices. According to the above-mentioned aspect of the present invention or a combination of the above-mentioned aspect of the present invention and another step to be further executed, it is possible to obtain an image display apparatus including the image display devices connected to the first wiring and the second wirings. Each of the portions to which the voltage is applied in the step of applying the voltage may be provided with an image display function before the step of applying the voltage is executed. The image display function is a function for emitting electrons in the case where each of the image display devices is an electron-emitting device. The image display function is a light emission function in the case of an EL device. In such cases, when the step of applying the voltage is used, the image display function can be improved (for example, electron emission efficiency and light emission efficiency are improved) and stabilized. Each of the portions to which the voltage is applied in the step of applying the voltage is not necessarily provided with an image display function before the step of applying the voltage is executed. In such a case, when the step of applying the voltage is used, the image display function can be provided and then the image display function can be improved and stabilized.

It is desirable that each of the portions to which the voltage is applied in the step of applying the voltage have a nonlinear characteristic. In particular, it is suitable that each of the portions have a threshold characteristic with respect to an applied voltage. For example, there is a structure in which a threshold characteristic on a quantity of a current flowing according to the applied voltage is provided. According to the threshold characteristic, when the applied voltage does not exceeds a threshold voltage, a state in which the current hardly flows can be obtained. When the applied voltage exceeds the threshold voltage, a necessary quantity of current flows. It is possible to suitably employ a structure in which a threshold characteristic on luminance obtained according to the applied voltage is provided.

In the application concerned, assume that min(j, k) indicates a minimum value between j and k, and max(j, k) indicates a maximum value between j and k.

According to the above-mentioned aspect of the present invention, it is possible to suitably employ a structure in which at least one of the set value $V_j$ at the j-th position, a set value $V_{j-1}$ at a (j−1)-th position, and a set value $V_{j-2}$ at a (j−2)-th position is set by the following expression.

$$V_j = V_{j-1} + \frac{R_{j-1}}{R_{j-2}}(V_{j-1} - V_{j-2}) + R_{j-1} I_{j-1}$$

$$V_j = D_L a_j + D_R b_j - \sum_{k=1}^{n} c_{j,k} I_k$$

It is possible to suitably employ a structure in which the two other set values are calculated by the above-mentioned expression. Because $$V_j = V_{j-1} + \frac{R_{j-1}}{R_{j-2}}(V_{j-1} - V_{j-2}) + R_{j-1} I_{j-1}$$

is a recurrence equation, set values associated with two adjacent positions is obtained by, for example, the following expression.

$$V_j = D_L a_j + D_R b_j - \sum_{k=1}^{n} c_{j,k} I_k$$

After that, the set values associated with the respective positions can be successively calculated by.

$$V_j = V_{j-1} + \frac{R_{j-1}}{R_{j-2}}(V_{j-1} - V_{j-2}) + R_{j-1} I_{j-1}$$

Further, the following aspect is included. That is, there is provided a method of manufacturing an image display apparatus including at least one first wiring, a plurality of image display devices connected to the first wiring, and a plurality of second wirings connected to the plurality of image display devices, including the steps of:

determining a signal applied to the second wirings; and applying a voltage to portions connected to the first wiring and the second wirings by application of a potential $D_L$ to a first predetermined position of the first wiring, application of a potential $D_R$ to a second predetermined position thereof, and application of the signal to the plurality of second wirings, in which the determining step includes a step of setting a set value $V_j$ associated with a j-th position of a plurality of n positions (where j and n each are a positive integer) located between the first predetermined position and the second predetermined position on the first wiring, in which in the setting step, the set value $V_j$ is set by the following expression:

$$V_j = D_L a_j + D_R b_j - \sum_{k=1}^{n} c_{j,k} I_k$$

where $I_k$ denotes a current quantity flowing from a k-th position of the n positions, in which when N (where N is an integer and n≦N) subsidiary positions are set on the first wiring, the n positions correspond to $S_1$-th to $S_n$-th subsidiary positions, a resistance between adjacent subsidiary positions is a same value r, a resistance between a first subsidiary position and one of the first predetermined position and the second predetermined position which is closer to the first subsidiary position is $R_L$, a resistance between an n-th subsidiary position and one of the first predetermined position and the second predetermined position which is closer to the n-th subsidiary position is $R_R$, a resistance between both ends of the first wiring is $R_{all}$, min(j, k) indicates a minimum value between j and k, and max(j, k) indicates a maximum value between j and k, $a_j$, $b_j$, and $C_{j,k}$ are expressed by:

$$a_j = \frac{1}{R_{all}}\{R_R + (N - S_j)r\}$$

$$b_j = \frac{1}{R_{all}}\{R_L + (S_j - 1)r\}$$

$$c_{j,k} = \frac{1}{R_{all}}\{R_L + (S_{min(j,k)} - 1)r\}\{R_R + (N - S_{max(j,k)})r\}$$

in which the setting step includes a step of setting the current quantity $I_k$ based on a result obtained by measurement of currents flowing through the second wirings, and in which the determining step includes a step of determining the signal applied to the second wirings based on the set value $V_j$.

Here, it is possible to suitably employ an arrangement in which at least one of the set value $V_j$ at the j-th position, a set value $V_{j-1}$ at a (j−1)-th position, and a set value $V_{j-2}$ at a (j−2)-th position is set by the following expression.

$$V_j = V_{j-1} + \frac{S_j - S_{j-1}}{S_{j-1} - S_{j-2}}(V_{j-1} - V_{j-2}) + (S_j - S_{j-1}) r I_{j-1}$$

Further, the following aspect is included. That is, there is provided a method of manufacturing an image display apparatus including at least one first wiring, a plurality of image display devices connected to the first wiring, and a plurality of second wirings connected to the plurality of image display devices, including the steps of:

determining a signal applied to the second wirings; and applying a voltage to portions connected to the first wiring and the second wirings by application of a potential $D_L$ to a first predetermined position of the first wiring, application of a potential $D_R$ to a second predetermined position thereof, and application of the signal to the plurality of second wirings, in which the determining step includes a step of setting a set value $V_j$ associated with a j-th position of a plurality of n positions (where j and n each are a positive integer) located between the first predetermined position and the second predetermined position on the first wiring, in which in the setting step, the set value $V_j$ is set by the following expression $$V_j = D_L a_j + D_R b_j - \sum_{k=1}^{n} c_{j,k} I_k$$

where $I_k$ denotes a current quantity flowing from a k-th position of the n positions, in which when a resistance between adjacent positions on the first wiring is a same value r, a resistance between a first position and one of the first predetermined position and the second predetermined position which is closer to the first position is $R_L$, a resistance between an n-th position and one of the first predetermined position and the second predetermined position which is closer to the n-th position is $R_R$, and a resistance between both ends of the first wiring is $R_{all}$, $a_j$, $b_j$, and $C_{j,k}$ are expressed by $$a_j = \frac{1}{R_{all}}\{R_R + (n - j)r\}$$

$$b_j = \frac{1}{R_{all}}\{R_L + (j - 1)r\}$$

$$c_{j,k} = \frac{1}{R_{all}}\{R_L + (\min(j, k) - 1)r\}\{R_R + (n - \max(j, k))r\}$$

in which the setting step includes a step of setting the current quantity $I_k$ based on a result obtained by measurement of currents flowing through the second wirings, and in which the determining step includes a step of determining the signal applied to the second wirings based on the set value $V_j$.

Here, it is possible to suitably employ an arrangement in which at least one of the set value $V_j$ at the j-th position, a set value $V_{j-1}$ at a (j−1)-th position, and a set value $V_{j-2}$ at a (j−2)-th position is set by the following expression.

$$V_j = 2V_{j-1} - V_{j-2} + rI_{j-1}$$

Further, the following aspect is included. That is, there is provided a method of manufacturing an image display apparatus including at least one first wiring, a plurality of image display devices connected to the first wiring, and a plurality of second wirings connected to the plurality of image display devices, including the steps of:

determining a signal applied to the second wirings; and applying a voltage to portions connected to the first wiring and the second wirings by application of a potential D to a first predetermined position of the first wiring, setting of an open state of an end portion of the first wiring which is separated from the first predetermined position, and application of the signal to the plurality of second wirings, in which the determining step includes a step of setting a set value $V_j$ associated with a j-th position of a plurality of n positions (where j and n each are a positive integer) located between the first predetermined position and the end portion on the first wiring, in which position numbers of the n positions (where n is positive integer) on the first wiring, which are counted from the first predetermined position to the end portion are 1, 2, . . . , n, a current value in the case where a sign of a direction of a current flowing from the j-th position is positive is $I_j$, a resistance between the j-th position and the (j+1)-th position is $R_j$, in the case where a resistance between the first position and the first predetermined position is $R_0$, $$I_{rem1} = \sum_{k=1}^{n} I_k$$

$$V_1 = D - a_0 I_{rem1}$$

$$a_j = R_j$$

$$I_{remj} = I_{remj-l} - I_{j-1}$$

$$V_j = V_{j-1} - a_{j-1} I_{remj}$$

the set value $V_j$ associated with the j-th position is set by the following expression $$V_j = V_{j-1} - a_{j-1} I_{remj}$$

where j is 2, 3, . . . , n−1 in which the setting step includes a step of setting the current quantity $I_k$ based on a result obtained by measurement of currents flowing through the second wirings, and in which the determining step includes a step of determining the signal applied to the second wirings based on the set value $V_j$.

Further, the following aspect is included. That is, there is provided a method of manufacturing an image display apparatus including at least one first wiring, a plurality of image display devices connected to the first wiring, and a plurality of second wirings connected to the plurality of image display devices, including the steps of:

determining a signal applied to the second wirings; and applying a voltage to portions connected to the first wiring and the second wirings by application of a potential D to a first predetermined position of the first wiring, setting of an open state of an end portion of the first wiring which is separated from the first predetermined position, and application of the signal to the plurality of second wirings, in which the determining step includes a step of setting a set value $V_j$ associated with a j-th position of a plurality of n positions (where j and n each are a positive integer) located between the first predetermined position and the end portion on the first wiring, in which position numbers of the n positions (where n is positive integer) on the first wiring, which are counted from the first predetermined position to the end portion are 1, 2, . . . , n, a current value in the case where a sign of a direction of a current flowing from the j-th position is positive is $I_j$, N (where N is an integer and n≦N) subsidiary positions are set on the first wiring, the n positions correspond to $S_1$-th to $S_n$-th subsidiary positions, a resistance between adjacent subsidiary positions is a same value r, a resistance between a first subsidiary position and the first predetermined position is $R_L$, and when $$I_{rem1} = \sum_{k=1}^{n} I_k$$

$$V_1 = D - a_0 I_{rem1}$$

$$a_0 = R_L + (S_1 - 1)r$$

$$a_j = (S_{j+1} - S_j)r$$

$$I_{remj} = I_{remj-1} - I_{j-1}$$

$$V_j = V_{j-1} - a_{j-1} I_{remj}$$

the set value $V_j$ associated with the j-th position is set by the following expression $$V_j = V_{j-1} - a_{j-1} I_{remj}$$

where j is 2, 3, . . . , n−1, in which the setting step includes a step of setting the current quantity $I_k$ based on a result obtained by measurement of currents flowing through the second wirings, and in which the determining step includes a step of determining the signal applied to the second wirings based on the set value $V_j$.

Further, the following aspect is included. That is, there is provided a method of manufacturing an image display apparatus including at least one first wiring, a plurality of image display devices connected to the first wiring, and a plurality of second wirings connected to the plurality of image display devices, including the steps of:

determining a signal applied to the second wirings; and applying a voltage to portions connected to the first wiring and the second wirings by application of a potential D to a first predetermined position of the first wiring, setting of an open state of an end portion of the first wiring which is separated from the first predetermined position, and application of the signal to the plurality of second wirings, in which the determining step includes a step of setting a set value $V_j$ associated with a j-th position of a plurality of n positions (where j and n each are a positive integer) located between the first predetermined position and the end portion on the first wiring, in which position numbers of the n positions (where n is positive integer) on the first wiring, which are counted from the first predetermined position to the end portion are 1, 2, . . . , n, a current value in the case where a sign of a direction of a current flowing from the j-th position is positive is $I_j$, a resistance between adjacent subsidiary positions is a same value r, a resistance between a first subsidiary position and the first predetermined position is $R_L$, and when $$I_{rem1} = \sum_{k=1}^{n} I_k$$

$$V_1 = D - a_0 I_{rem1}$$

$$a_0 = R_L$$

$$a_j = r$$

$$I_{remj} = I_{remj-1} - I_{j-1}$$

$$V_j = V_{j-1} - a_{j-1} I_{remj}$$

the set value $V_j$ associated with the j-th position is set by the following expression $$V_j = V_{j-1} - a_{j-1} I_{remj}$$

where j is 2, 3, . . . , n−1, in which the setting step includes a step of setting the current quantity $I_k$ based on a result obtained by measurement of currents flowing through the second wirings, and in which the determining step includes a step of determining the signal applied to the second wirings based on the set value $V_j$.

According to the above-mentioned respective aspects of the present invention, it is possible to suitably employ an arrangement in which each of the n positions on the first wiring is set to be included in each of groups G1 to Gm of m (integer) smaller than n, a representative position of position coordinates in each of the groups is expressed by one of P1 to Pm, a sum of currents flowing from the positions included in each of the groups is set as one of representative position currents I1 to Im flowing from the representative positions P1 to Pm, and representative set values V1 to Vm associated with the groups are set by the step of setting the set value $V_j$.

With this arrangement, it is possible to suitably employ an arrangement in which potentials at positions other than the representative positions are obtained by polynomial interpolation based on potentials at the representative positions P1 to Pm included in the groups G1 to Gm of m and a potential applied to the first wiring.

According to the above-mentioned respective aspects of the present invention, it is possible to suitably employ an arrangement in which the n positions are set corresponding to intersections between the first wiring and the plurality of second wirings.

According to the above-mentioned respective aspects of the present invention, it is possible to suitably employ an arrangement in which the image display apparatus includes a plurality of first wirings and performs the determining step and applying step for each of the first wirings.

According to the above-mentioned respective aspects of the present invention, it is possible to suitably employ an arrangement further including the step of setting a potential to a plurality of positions on the second wirings, in which the signal applied to the second wirings is determined based on the potential set by the setting step and the set value $V_j$. With this arrangement, it is suitable that portions to which the voltage is applied are connected between a plurality of positions on each of the first wirings and the plurality of positions on the second wirings. Further, with this arrangement, it is possible to suitably employ an arrangement in which when each of the first wirings is a row wiring, each of the second wirings is a column wiring, a potential on a row wiring at a position of i-th row and j-th column is $Y_{i,j}$, a potential on a column wiring at the position of i-th row and j-th column is $X_{i,j}$, a current flowing from a row wiring side to a column wiring side at the position of i-th row and j-th column is $I_{i,j}$, and a resistance value of a resistor which is provided in series with a portion between the row wiring and the column wiring at the position of i-th row and j-th column is $R_{i,j}$, a voltage $V_{i,j}$ applied to the portion is set by the following expression $$V_{i,j} = Y_{i,j} - X_{i,j} - R_{i,j} I_{i,j}$$

where i and j each are a positive integer.

In the invention as claimed in the application concerned, a position from or into which a current flows (node) can be suitably employed as the position for obtaining a set value corresponding to a potential.

The application concerned includes the following aspect of the present invention. That is, in a node potential calculating method of calculating a potential at a node located in a predetermined position on a wiring of a network including a plurality of wirings, when n nodes are located between one end of the wiring in which a potential $D_L$ is set and the other end of the wiring in which a potential $D_R$ is set and a current value flowing from a j-th node counted from the one end is $I_j$, a node potential $V_j$ is calculated by the following expression.

$$V_j = D_L a_j + D_R b_j - \sum_{k=1}^{n} c_{j,k} I_k$$

Here, j, k, n each indicate a positive integer and $a_j$ in the first term and $b_j$ in the second term indicate distribution coefficients for the potentials $D_L$ and $D_R$ in the position of the node, each of which is an array element composed of n components. The third term is a term related to voltage drop caused by wiring resistance and $C_{j,k}$ denotes matrix elements of n-column and n-column.

The application concerned includes the following aspect of the present invention. That is, there is provided a method of driving nonlinear devices which are connected to row wirings and column wirings and arranged in matrix, in which when a predetermined terminal potential is applied to at least one end of a row wiring and at least one end of a column wiring, a difference between a compensation quantity for voltage drop at each of the nodes which is caused by a wiring resistance of the row wiring and a wiring resistance of the column wiring and a voltage drop quantity at each of the nodes which is calculated by the node potential calculation method is in a range of −3% to +3%.

The application concerned includes the following aspect of the present invention. That is, each of the nonlinear devices is an electron-emitting device, and there is provided an electron source manufacturing method including an activation process for providing an activation material to the electron-emitting device using the nonlinear device driving method of continuously applying a pulse voltage to at least one end of each of row wirings and at least one end of each of column wirings, in which an application of the pulse voltage includes a first step of selecting m row wirings and applying a first pulse voltage to at least one end of each of the selected row wirings and a second step of selecting n column wirings and applying a second pulse voltage to at least one end of each of the selected column wirings simultaneously with the first step.

The application concerned includes the following aspect of the present invention. That is, there is provided a method of manufacturing an image display apparatus including the electron source and a phosphor for generating light in response to electrons emitted from the electron source, the manufacturing method including a preparative driving process for applying a preparative driving voltage higher than a driving voltage used for normal image display to the electron source in a vacuum atmosphere before the normal image display is performed, in which the preparative driving process is performed by the nonlinear device driving method.

The application concerned includes the following aspect of the present invention. That is, there is provided a method of driving the nonlinear devices, in which when a predetermined terminal potential is applied to at least one end of a row wiring and at least one end of a column wiring, a difference between a compensation quantity for voltage drop at each of the nodes which is caused by a wiring resistance of the row wiring and a wiring resistance of the column wiring and a voltage drop quantity at each of the nodes which is calculated by the node potential calculation method is in a range of −3% to +3%.

The application concerned includes the following aspect of the present invention. That is, there is provided a method of driving the nonlinear devices, in which each of the nonlinear devices is connected in series to a node resistor having a linear resistance component, a difference between a compensation quantity for voltage drop at each of the nodes which is caused by a wiring resistance of a row wiring and a wiring resistance of a column wiring and a voltage drop quantity at each of the nodes which is calculated by the node potential calculation method is in a range of −3% to +3% when a predetermined terminal potential is applied to at least one end of the row wiring and at least one end of the column wiring, and a compensation quantity for voltage drop which is caused by the node resistor is obtained as the product of a resistance of the node resistor and a node current associated therewith.

The application concerned includes the following aspect of the present invention. That is, each of the nonlinear devices is an electron-emitting device, and there is provided an electron source manufacturing method including an activation process for providing an activation material to the electron-emitting device using the nonlinear device driving method of continuously applying a pulse voltage to at least one end of each of row wirings and at least one end of each of column wirings, in which an application of the pulse voltage includes a first step of selecting m row wirings and applying a first pulse voltage to at least one end of each of the selected row wirings and a second step of selecting n column wirings and applying a second pulse voltage to at least one end of each of the selected column wirings simultaneously with the first step.

The application concerned includes the following aspect of the present invention. That is, there is provided a method of manufacturing an electron source including:

(1) a voltage applying step of performing an voltage application to provide a plurality of potential level differences between a first pulse voltage level and a second pulse voltage level;

(2) a current measuring step of measuring terminal currents flowing through the selected row wirings and the selected column wirings at the plurality of potential level differences during the voltage applying step;

(3) a node voltage calculating step of calculating node potentials on the selected row wirings and the selected column wirings at the plurality of potential level differences based on terminal voltages applied during the voltage applying step, the terminal currents measured by the current measuring step, wiring resistances of the row wirings, and resistances of the column wirings;

(4) a node resistance calculating step of calculating a node resistance of a linear resistor connected in series to each of the nodes based on the node potentials associated with the plurality of potential level differences which are calculated by the node voltage calculating step and node currents associated with the plurality of potential level differences which are obtained by the current measuring step; and (5) a voltage renewing step of renewing the terminal voltage levels based on the node currents, the node resistances, the wiring resistances of the row wirings, and the resistances of the column wirings, in which a compensation quantity for voltage drop caused in each of the nodes is a potential difference between a row wiring node and a column wiring node, which is calculated by the node voltage calculating step with respect to each of the nodes.

The application concerned includes the following aspect of the present invention. That is, there is provided a method of manufacturing an image display apparatus including the electron source and a phosphor for generating light in response to electrons emitted from the electron source, the image display apparatus manufacturing method including a preparative driving process for applying a preparative driving voltage higher than a driving voltage used for normal image display to the electron source in a vacuum atmosphere before the normal image display is performed, in which the preparative driving process is performed by the above-mentioned driving method.

The application concerned includes the following aspect of the present invention. That is, there is provided a method of manufacturing an image display apparatus including the electron source and a phosphor for generating light in response to electrons emitted from the electron source, and the manufacturing method including a preparative driving process for applying a preparative driving voltage higher than a driving voltage used for normal image display to the electron source in a vacuum atmosphere before the normal image display is performed.

The application concerned includes the following aspect of the present invention. That is, there is provided a method of manufacturing an image display apparatus including the electron source manufactured by the above-mentioned electron source manufacturing method and a phosphor for generating light in response to electrons emitted from the electron source, in which the image display apparatus manufacturing method includes an activation process for applying a voltage to a device portion to provide an activation material to the device portion.

In the activation process or the preparative driving process, assume that L (L is positive integer) levels of voltage values effectively applied to a selected electron-emitting device are $Vg_1$ to $Vg_L$, node measurement values flowing through the node with respect to the effective voltage levels $Vg_1$ to $Vg_L$ are $I_1$ to $I_L$, an estimated value $B_{est}$ of field conversion coefficient proportional term is expressed by the following expression using weighting factors $w_1$ to $w_L$ associated with the respective voltage levels.

$$B_{est} = \frac{\left(\sum_{k=1}^{L} \frac{w_k}{Vg_k}\right)^2 - \left(\sum_{k=1}^{L} w_k\right)\left(\sum_{k=1}^{L} \frac{w_k}{Vg_k^2}\right)}{\left(\sum_{k=1}^{L} w_k\right)\left(\sum_{k=1}^{L} \frac{w_k}{Vg_k}\log\left(\frac{I_k}{Vg_k^2}\right)\right) - \left(\sum_{k=1}^{L} \frac{w_k}{Vg_k}\right)\left(\sum_{k=1}^{L} w_k\log\left(\frac{I_k}{Vg_k^2}\right)\right)}$$

Then, when a value of the node resistance after renewal is $R^{(new)}$, a value of the node resistance before renewal is performed is $R^{(old)}$, a target value of field conversion coefficient proportional term is $B_{dst}$, and a proportional constant is k (k>0), it is possible to suitably employ a node resistance calculating step of obtaining a node resistance estimation value by renewal using ($R^{(new)}=R^{(old)}+k(B_{est}-B_{dst})$). In addition, it is possible to suitably employ an arrangement in which a weighting factor $w_k$ for a k-th level is as follows.

$$W_k=1$$

It is possible to suitably employ an arrangement in which a weighting factor $w_k$ for a k-th level is as follows.

$$w_k=I_k^2$$

According to the invention as claimed in the application concerned, the values corresponding to the potentials in the positions on the wirings can be adequately set based on the measured current values. When such set values are used, a preferable image display apparatus can be obtained.

Although described later in detail, according to the following embodiments described below, the node potential calculation for a network having current flow nodes in wirings and a matrix network can be performed with high precision in high speed. Further, according to the drive method of the present invention, uniform voltages can be applied to the plurality of nonlinear devices connected in matrix. In particular, in a process for manufacturing an electron source and an image display apparatus, including the activation process and the preparative driving process, the voltages applied to the respective electron-emitting devices can be made more uniform, so that electron emission characteristics are made more even. Therefore, the image display apparatus produced by the present invention has superior display reproducibility and can display a preferable image with less surface roughness.

DESCRIPTION OF THE PREFERRED EMBODIMENTS

An arrangement of a network to which the present invention is applicable will be described with reference to FIGS. 1A, 1B, and 1C.

Figure 1A:
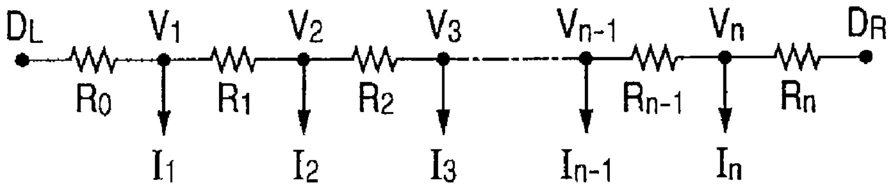
FIGS. 1A, 1B, and 1C are explanatory circuit diagrams showing networks to which the present invention is applicable.

FIG. 1A shows a state in which potentials at both ends of a wiring are specified and currents flow from n nodes provided on the wiring. In FIG. 1A, reference symbols $D_L$ and $D_R$ denote potentials for specifying the potentials at the ends of the wiring, $V_1$ to $V_n$ denote node potentials at first to n-th nodes, and $I_1$ to $I_n$ denote node currents in the case where a sign of a direction of a current flowing from each of the nodes is assumed to be positive. In addition, reference symbol $R_o$ denotes a resistance value between the first node and a first terminal (lead resistance) which is located closest thereto and to which the potential $D_L$ is applied, $R_n$ denotes a resistance value between the n-th node and a second terminal (lead resistance) which is located closest thereto and to which the potential $D_R$ is applied, and $R_j$ denotes a resistance value between a j-th node and a (j+1)-th node (where $1 \leqq j \leqq n-1$). A resistance value between the first and second terminals is expressed by $R_{all}$.

At this time, the inventors of the application concerned find that Numerical Expression 15 described below constantly holds among the respective node potentials, the terminal potentials, the node currents, and the resistance elements.

$$V_j = D_L\frac{1}{R_{all}}\sum_{q=j}^{n} R_q + D_R\frac{1}{R_{all}}\sum_{p=0}^{j-1} R_p - \sum_{k=1}^{n}\left(\frac{1}{R_{all}}\sum_{p=0}^{min(j,k)-1} R_p \sum_{q=max(j,k)}^{n} R_q\right)I_k \quad 15$$

-continued

Here, letting $$a_j = \frac{1}{R_{all}} \sum_{q=j}^{n} R_q \quad (16)$$

$$b_j = \frac{1}{R_{all}} \sum_{p=0}^{j-1} R_p$$

$$c_{j,k} = \frac{1}{R_{all}} \sum_{p=0}^{min(j,k)-1} R_p \sum_{q=max(j,k)}^{n} R_q$$

Numerical Expression 15 can be expressed in vector and matrix types as indicated below.

$$\begin{bmatrix} V_1 \\ \vdots \\ V_j \\ \vdots \\ V_n \end{bmatrix} = D_L \begin{bmatrix} a_1 \\ \vdots \\ a_j \\ \vdots \\ a_n \end{bmatrix} + D_R \begin{bmatrix} b_1 \\ \vdots \\ b_j \\ \vdots \\ b_n \end{bmatrix} - \begin{bmatrix} c_{1,1} & \cdots & c_{1,k} & \cdots & c_{1,n} \\ \vdots & & \vdots & & \vdots \\ c_{j,1} & \cdots & c_{j,k} & \cdots & c_{j,n} \\ \vdots & & \vdots & & \vdots \\ c_{n,1} & \cdots & c_{n,k} & \cdots & c_{n,n} \end{bmatrix} \begin{bmatrix} I_1 \\ \vdots \\ I_k \\ \vdots \\ I_n \end{bmatrix}$$

This is expressed as follows using matrix elements.

$$V_j = D_L a_j + D_R b_j - \sum_{k=1}^{n} c_{j,k} I_k \quad (17)$$

In the case where the type of Numerical Expression 17 is used and the terminal potentials, the node currents, and the resistance elements are known, even when a calculation method, such as an iterative calculation method, which takes a time is not used, it is possible to directly obtain the node potentials.

The following relationship holds between the node potentials at adjacent nodes.

$$V_j = V_{j-1} + \frac{R_{j-1}}{R_{j-2}}(V_{j-1} - V_{j-2}) + R_{j-1} I_{j-1} \quad (18)$$

When the above-mentioned expressions are used, the node potentials can be calculated. For example, the node potentials $V_1$ and $V_2$ at the first node and the second node can be calculated using Numerical Expression 15 and the node potentials $V_3$ to $V_n$ can be calculated using Numerical Expression 18.

When all the node potentials are calculated with respect to "j" using Numerical Expression 15, a calculation load becomes the order of the square of n. However, when the above-mentioned recurrence equation is used, the calculation load becomes the order of the first power of n, so it is possible to obtain a node potential result at high speed.

When there is a specific relationship among the respective resistance elements, coefficients $a_j$, $b_j$, and $c_{j,k}$ of Numerical Expressions 16 can be obtained in a simple way. The coefficients will be described with reference to a network to which the present invention is applicable, shown in FIG. 1B.

Figure 1B:
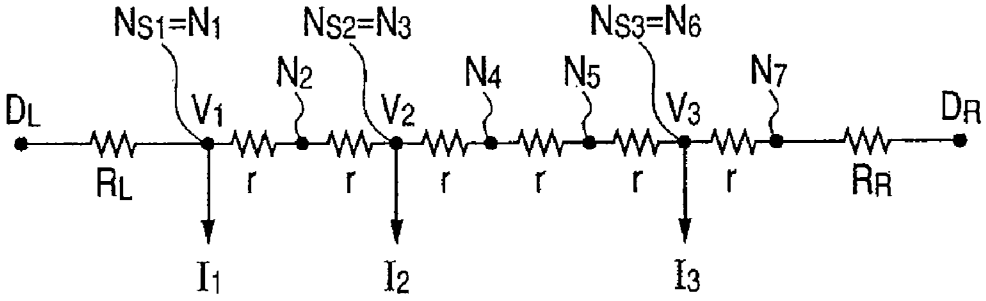

FIG. 1B shows a state in which potentials at both ends of a wiring are specified and currents flow from three main nodes of seven subsidiary nodes provided on the wiring. In FIG. 1B, reference symbols $D_L$ and $D_R$ denote potentials at the ends of the wiring, $N_1$ to $N_7$ denote subsidiary nodes, and $S_1$ to $S_7$ denote indexes for which subsidiary node numbers corresponding to main node numbers 1 to 3 are provided. Reference symbols $V_1$ to $V_3$ denote main node potentials at first to third main nodes, $I_1$ to $I_3$ denote main node currents in the case where a sign of a direction of a current flowing from each of the main nodes is assumed to be positive. Reference symbol $R_L$ denotes a lead resistance value between the subsidiary node $N_1$ and a first terminal which is located closest to the subsidiary node $N_1$ and to which the potential $D_L$ is applied, $R_R$ denotes a lead resistance value between the subsidiary node $N_7$ and a second terminal which is located closest to the subsidiary node $N_7$ and to which the potential $D_R$ is applied, and $R_{all}$ denotes a resistance value between the first and second terminals. A resistance element between the respective adjacent subsidiary nodes is set to the same value and this value is expressed by "r".

At this time, Numerical Expressions 16 can be simplified as follows.

$$a_j = \frac{1}{R_{all}}\{R_R + (7 - S_j)r\} \quad \text{for } j = 1, \ldots, 7$$

$$b_j = \frac{1}{R_{all}}\{R_L + (S_j - 1)r\} \quad \text{for } j = 1, \ldots, 7$$

$$c_{j,k} = \frac{1}{R_{all}}\{R_L + (S_{min(j,k)} - 1)r\} \quad \text{for } \begin{cases} j = 1, \ldots, 7 \\ k = 1, \ldots, 7 \end{cases}$$
$$\{R_R + (7 - S_{max(j,k)})r\}$$

The above-mentioned relationships are generally shown below. When n main nodes of the N subsidiary nodes ($n \leqq N$) are indicated by the indexes $S_1$ to $S_n$, for the subsidiary nodes, the following expressions are obtained.

$$a_j = \frac{1}{R_{all}}\{R_R + (N - S_j)r\} \quad \text{for } j = 1, \ldots, n \quad (19)$$

$$b_j = \frac{1}{R_{all}}\{R_L + (S_j - 1)r\} \quad \text{for } j = 1, \ldots, n$$

$$c_{j,k} = \frac{1}{R_{all}}\{R_L + (S_{min(j,k)} - 1)r\} \quad \text{for } \begin{cases} j = 1, \ldots, n \\ k = 1, \ldots, n \end{cases}$$
$$\{R_R + (N - S_{max(j,k)})r\}$$

At this time, a recurrence equation corresponding to Numerical Expression 18 is expressed as follows.

$$V_j = V_{j-1} + \frac{S_j - S_{j-1}}{S_{j-1} - S_{j-2}}(V_{j-1} - V_{j-2}) + (S_j - S_{j-1}) r I_{j-1} \quad (20)$$

Figure 1C:
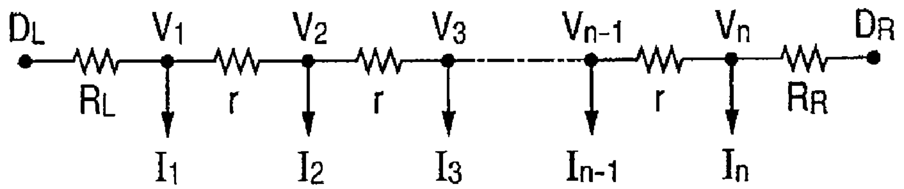

FIG. 1C shows an example of a circuit to which the present invention is applicable. When each of resistance elements holds the same value "r" as shown in the circuit of FIG. 1C, Numerical Expressions 16 are further simplified as follows.

$$a_j = \frac{1}{R_{all}}\{R_R + (n - j)r\} \quad (21)$$

$$b_j = \frac{1}{R_{all}}\{R_L + (j - 1)r\}$$

-continued $$c_{j,k} = \frac{1}{R_{all}}\{R_L + (\min(j, k) - 1)r\}\{R_R + (n - \max(j, k))r\}$$

A recurrence equation is expressed as follows.

$$V_j = 2V_{j-1} - V_{j-2} + rI_{j-1} \quad 22$$

Next, another arrangement of a network to which the present invention is applicable will be described with reference to FIG. 2.

Figure 2:
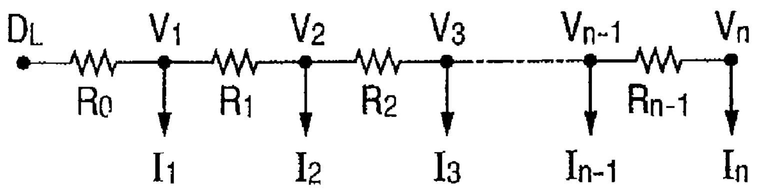
FIG. 2 is an explanatory circuit diagram showing a network to which the present invention is applicable.

FIG. 2 shows a state in which a potential at one end (leftmost end in FIG. 2) of a wiring is specified and currents flow from n nodes provided on the wiring. In FIG. 2, reference symbol D denotes a potential at the one end of the wiring, $V_1$ to $V_n$ denote node potentials at first to n-th nodes, and $I_1$ to $I_n$ denote node currents in the case where a sign of a direction of a current flowing from each of the nodes is assumed to be positive. In addition, reference symbol $R_o$ denotes a lead resistance value between the first node and a first terminal which is located closest thereto and to which the potential D is applied, and $R_j$ denotes a resistance element value between a j-th node and a (j+1)-th node (where $1 \leqq j \leqq n-1$).

At this time, when the terminal potentials, the node currents, and the resistance elements are known, the node potentials can be calculated as follows.

First, initial assignment statements are expressed as follows using a variable $I_{rem}$.

$$I_{rem} \leftarrow \sum_{k=1}^{n} I_k \quad 23$$

$$V_1 \leftarrow D - a_0 I_{rem}$$

The following calculations are performed in order with respect to the remaining second to n-th nodes.

$$I_{rem} \leftarrow I_{rem} - I_{j-1}$$

$$V_j \leftarrow V_{j-1} - a_{j-1} I_{rem} \quad 24$$

Here, the coefficient $a_j$ ($a_0$ and $a_{j-1}$) in Numerical Expressions 23 and Numerical Expressions 24 is equal to $R_j$.

The above-mentioned calculations are expressed as follows using an equation type instead of the assignment type.

Initial values of Irem and $V_j$ are expressed as follows.

$$I_{rem1} = \sum_{k=1}^{n} I_k$$

$$V_1 = D - a_0 I_{rem1}$$

A j-th variable $Irem_j$ and a j-th node potential $V_j$ are expressed by the following recurrence equations.

$$Irem_j = Irem_{j-1} - I_{j-1}$$

$$V_j = V_{j-1} - a_{j-1} Irem_j \text{ where } j=2,3,\ldots,(n-1)$$

Assume that the n nodes of the N subsidiary nodes (where $n \leqq N$) provided on the wiring are indicated by $S_1$ to $S_n$, the resistance between the adjacent subsidiary nodes is set to the same value "r", and the resistance between the first subsidiary node and the wiring end located closest thereto is expressed by $R_L$. In such a case, the coefficients $a_0$ and $a_j$ in Numerical Expressions 23 and Numerical Expressions 24 are expressed by the following expressions.

$$a_0 = R_L + (S_1 - 1)r$$

$$a_j = (S_{j+1} - S_j)r \text{ for } j=1,\ldots,n-1$$

Assume that the resistance between the adjacent nodes is set to the same value "r" and the resistance between the first node and the wiring end located closest thereto is expressed by $R_L$. In such a case, the coefficients $a_0$ and $a_j$ in Numerical Expressions 23 and Numerical Expressions 24 are expressed by the following expressions.

$$a_0 = R_L$$

$$a_j = r \text{ for } j=1,\ldots,n-1$$

Next, a method of calculating node potentials at high speed, which is one of node potential calculating methods in the present invention will be described with reference to FIGS. 3A, 3B, 3C and 3D.

Figure 3A:
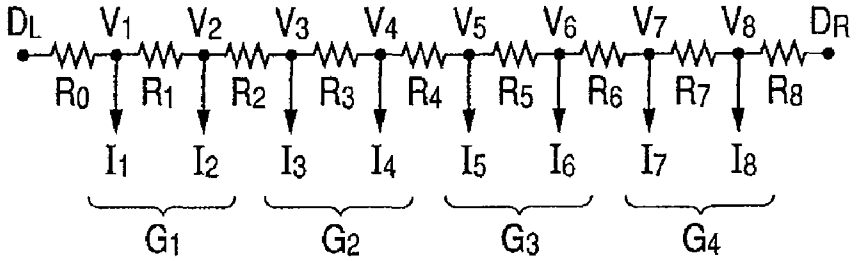
FIGS. 3A, 3B, 3C, and 3D are explanatory diagrams showing a method of further increasing a node potential calculation speed in the present invention.

FIG. 3A shows a state in which potentials at both ends of a wiring are specified and currents flow from n nodes (eight nodes in FIG. 3A) on the wiring. In FIG. 3A, reference symbols $D_L$ and $D_R$ denote potentials for specifying the potentials at the ends of the wiring, $V_1$ to $V_n$ denote node potentials at first to n-th nodes, and $I_1$ to $I_n$ denote node currents in the case where a sign of a direction of a current flowing from each of the nodes is assumed to be positive. In addition, reference symbol $R_o$ denotes a lead resistance value between the first node and a terminal which is located closest to the first node and to which the potential $D_L$ is applied, $R_n$ denotes a lead resistance value between the n-th node and a terminal which is located closest to the n-th node and to which the potential $D_R$ is applied, and $R_1$ to $R_{n-1}$ denote resistance values between the respective nodes.

First, in FIG. 3A, the first node and at least one node adjacent thereto are assigned to a group G1. Similarly, for the remaining nodes, another node and at least one node adjacent thereto are assigned to any one of groups. At this time, the total number of groups is set to m (where m<n) (four groups in FIG. 3).

Next, a representative position of positions of the nodes assigned to a group is calculated for each group and coordinates of the representative position are set as representative node coordinates Pm of the group. The representative node coordinates are set as appropriate by, for example, a method using a position corresponding to an average of distances between the wiring end and each of the nodes of the group or a method using a position in which a resistance value from the wiring end becomes equal to an average of resistance values between the wiring end and each of the nodes of the group.

Figure 3B:
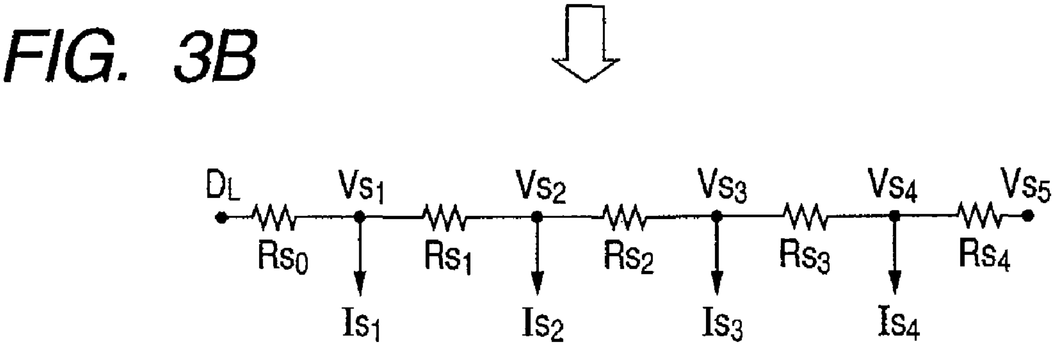

Then, assume that a total sum of node currents flowing through each of the groups is a node current flowing through the group and the respective node currents are indicated as representative node currents $Is_1$ to $Is_m$. Even in the case of the resistance element, the representative nodes are set as new nodes and representative resistance elements are expressed by $Rs_0$ to $Rs_m$ (FIG. 3B).

Figure 3C:
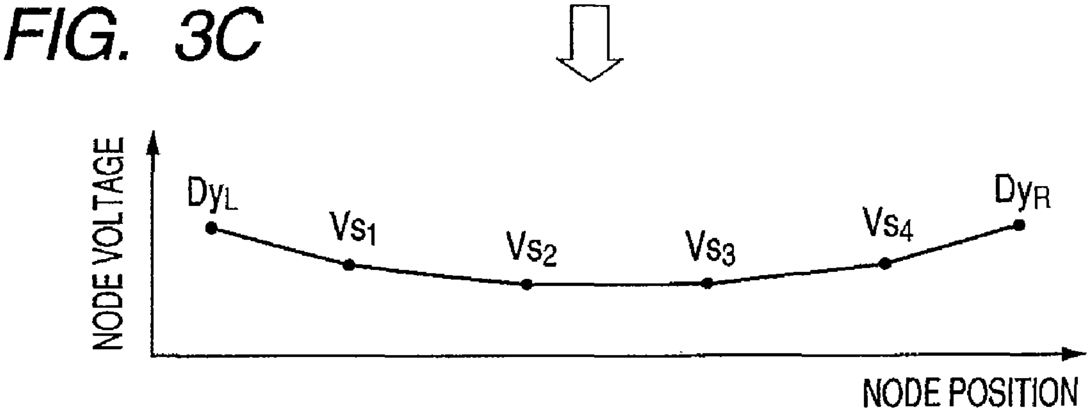

When the above-mentioned node potential calculating method is used based on the representative node currents $Is_1$ to $Is_m$, the representative resistance elements $Rs_0$ to $Rs_m$, and the terminal potentials $D_L$ and $D_R$, which are set as described above, representative node potentials $Vs_1$ to $Vs_m$ at the representative nodes are obtained (FIG. 3C).

Figure 3D:
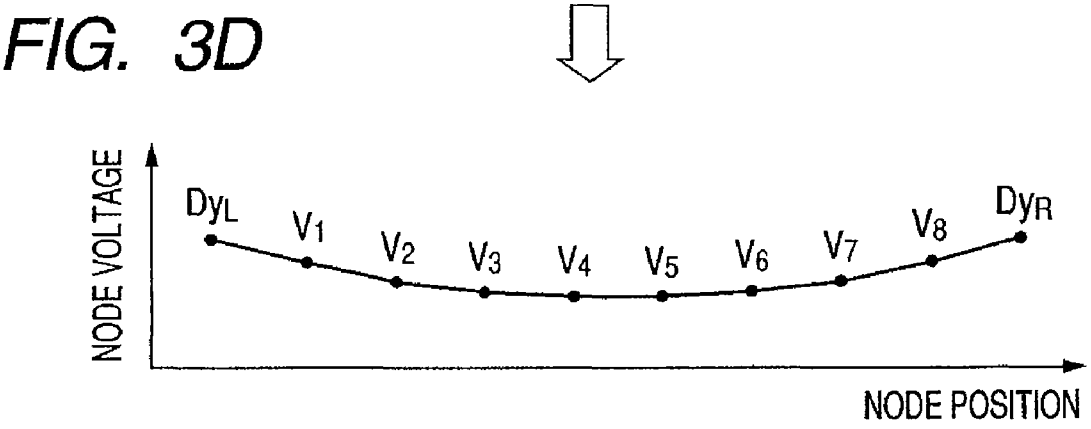

Then, polynomial interpolation is performed among the representative node potentials $Vs_1$ to $Vs_m$ and the terminal potentials to estimate the node potentials $V_1$ to $V_n$ at original node positions (FIG. 3D).

In the case where the above-mentioned method is used, in particular, when the number of groups (m) is made sufficiently smaller than the number of nodes (n), the calculation scale of the node potentials becomes smaller. Therefore, it is possible to calculate the node potentials at high speed.

Next, a matrix network which is one of networks to which the present invention is applicable will be described with reference to FIG. 4.

Figure 4:
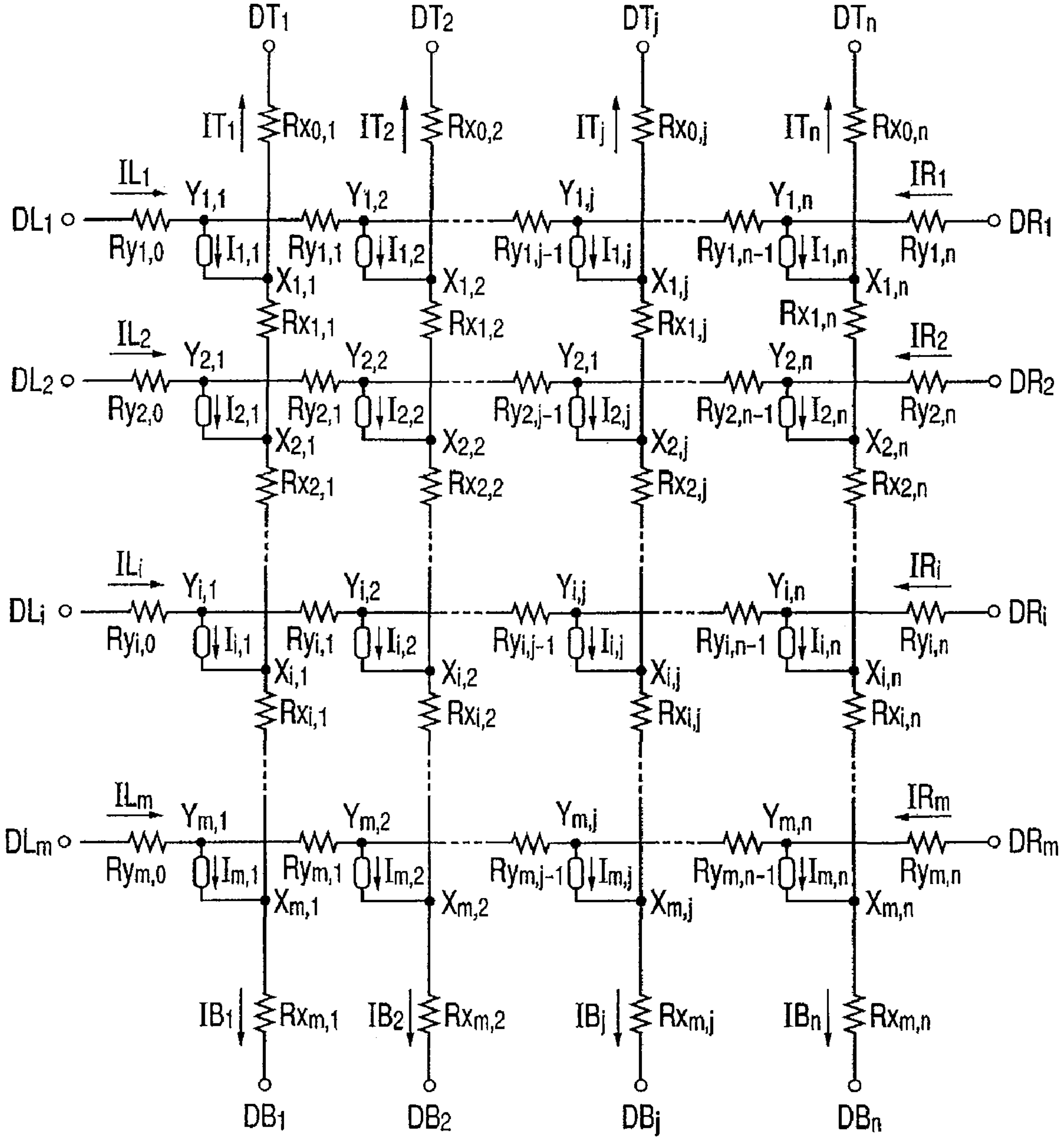
FIG. 4 is an explanatory circuit diagram showing a matrix network to which the present invention is applicable.

FIG. 4 shows an example of the matrix network in which m row wirings and n column wirings are arranged in a cross shape. In FIG. 4, reference symbols $I_{i,j}$ denotes a node current in the case where a sign of a current flowing from a row wiring side node to a column wiring side node at an intersection of i-th row and j-th column is assumed to be positive. Reference symbol $Y_{i,j}$ denotes a node potential on a row wiring at a node of i-th row and j-th column and $X_{i,j}$ denotes a node potential on a column wiring at the node of i-th row and j-th column. Reference symbol $Ry_{i,j}$ denotes a resistance between a node of j-th column on an i-th row wiring or one end of the row wiring thereof and a node of (j+1)-th column thereon or the other end of the row wiring thereof. Reference symbol $Rx_{i,j}$ denotes a resistance between a node of i-th column on a j-th column wiring or one end of the column wiring thereof and a node of (i+1)-th row thereon or the other end of the column wiring thereof. Reference symbols $DL_1$ to $DL_m$ denote terminal potentials which are provided to ends of row wirings closest to nodes of first column, and $DR_1$ to $DR_m$ denote terminal potentials which are provided to ends of row wirings closest to nodes of n-th column. Reference symbols $DT_1$ to $DT_n$ denote terminal potentials which are provided to ends of column wirings closest to nodes of first row, and $DB_1$ to $DB_n$ denote terminal potentials which are provided to ends of column wirings closest to nodes of m-th column.

When all values other than the node potentials on the row wirings and the column wirings are known, the respective node potentials can be calculated as follows. Note that an order for calculating the node potentials on the row wiring and the node potentials on the column wiring is not particularly important.

(1) The node potentials on the row wiring of i-th row are calculated based on the node currents, the resistance elements, and the terminal potentials on the i-th row wiring of by using the above-mentioned node potential calculating method for the wiring. This procedure is performed on each of the first to m-th rows.

(2) The node potentials on the row wiring of j-th column are calculated based on the node currents, the resistance elements, and the terminal potentials on the j-th column wiring of by using the above-mentioned node potential calculating method for the wiring. This procedure is performed on each of the first to n-th rows.

There is the case where the node currents at the respective nodes are unknown in the matrix network shown in FIG. 4. In such a case, the node currents are estimated based on wiring currents flowing through the respective wirings and the calculation is performed based on the estimated node currents by the above-mentioned procedure. Therefore, it is possible to estimate the node potentials at the respective nodes.

As an example of a method of estimating the node currents, there is a method of estimating the node currents based on a mean value of the wiring currents using the following expressions. Here, in FIG. 4, assume that reference symbols $IL_1$ to $IL_m$ denote currents values in the case where a direction of currents flowing from row wiring terminals to which the terminal potentials $DL_1$ to $DL_m$ are provided is positive, $IR_1$ to $IR_m$ denote currents values in the case where a direction of currents flowing from the row wiring terminals to which the terminal potentials $DR_1$ to $DR_m$ are provided is positive, $IT_1$ to $IT_n$ denote currents values in the case where a direction of currents flowing into column wiring terminals to which the terminal potentials $DT_1$ to $DT_n$ are provided is positive, and $IB_1$ to $IB_n$ denote currents values in the case where a direction of currents flowing into the column wiring terminals to which the terminal potentials $DB_1$ to $DB_n$ are provided is positive.

$$I_{i,j} = \frac{1}{n}(IL_i + IR_i) \text{ for } j = 1, \ldots, n \tag{25}$$

or $$I_{i,j} = \frac{1}{m}(IT_j + IB_j) \text{ for } i = 1, \ldots, m \tag{26}$$

In the case where the device located at each of the matrix intersections is a device such as a linear resistor, when effective potentials are not applied to all the row wirings and all the column wirings and the provided terminal potentials are not set to values for canceling voltage drops caused by wiring resistances, the method of estimating the node currents based on the average value of the wiring currents is ineffective. This is because, when a terminal voltage applied to of a part of the wirings is zero or an indefinite potential, currents flow through other paths, so that the influence of the node currents flowing through the matrix intersections cannot be neglected.

On the other hand, when the device located at each of the matrix intersections is a nonlinear device, a range capable of applying the above-mentioned method becomes wider.

Figure 5:
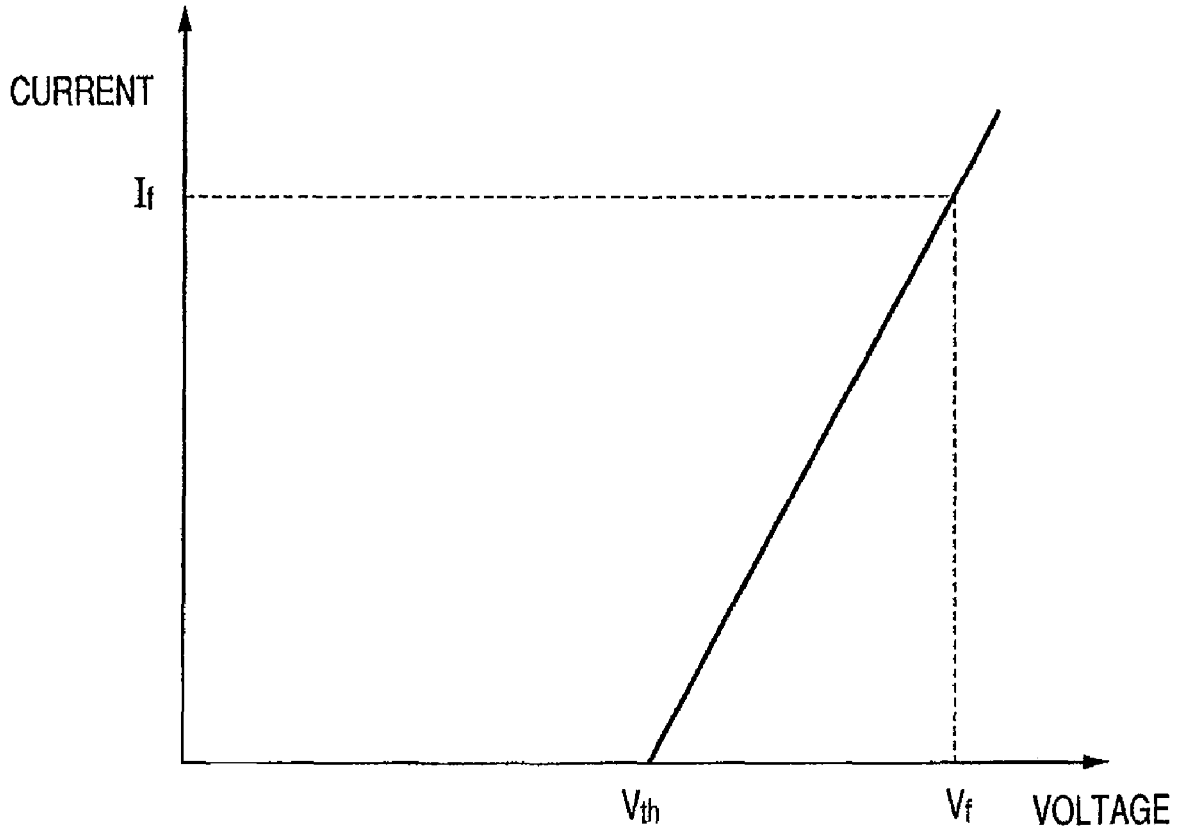
FIG. 5 is a schematic graph showing a voltage-current characteristic of a nonlinear device used for the network to which the present invention is applicable.

FIG. 5 shows a voltage-current characteristic of a device to which the present invention is applicable. FIG. 5 is a graph showing a relationship between a voltage applied between two terminals of the device and a current flowing between the two terminals thereof. As shown in FIG. 5, the device to which the present invention is applicable is a nonlinear device in which any current hardly flow while an applied voltage is equal to or smaller than a threshold voltage V-th and the current significantly flows when a voltage which exceeds V-th is applied. Examples of the device having such a characteristic include a diode device, an LED device, an electroluminescence device, an MIM device, a field emission electron-emitting device (FED), a ballistic electron surface-emitting device (BSD), and a surface conduction electron-emitter (SCE).

Figure 6:
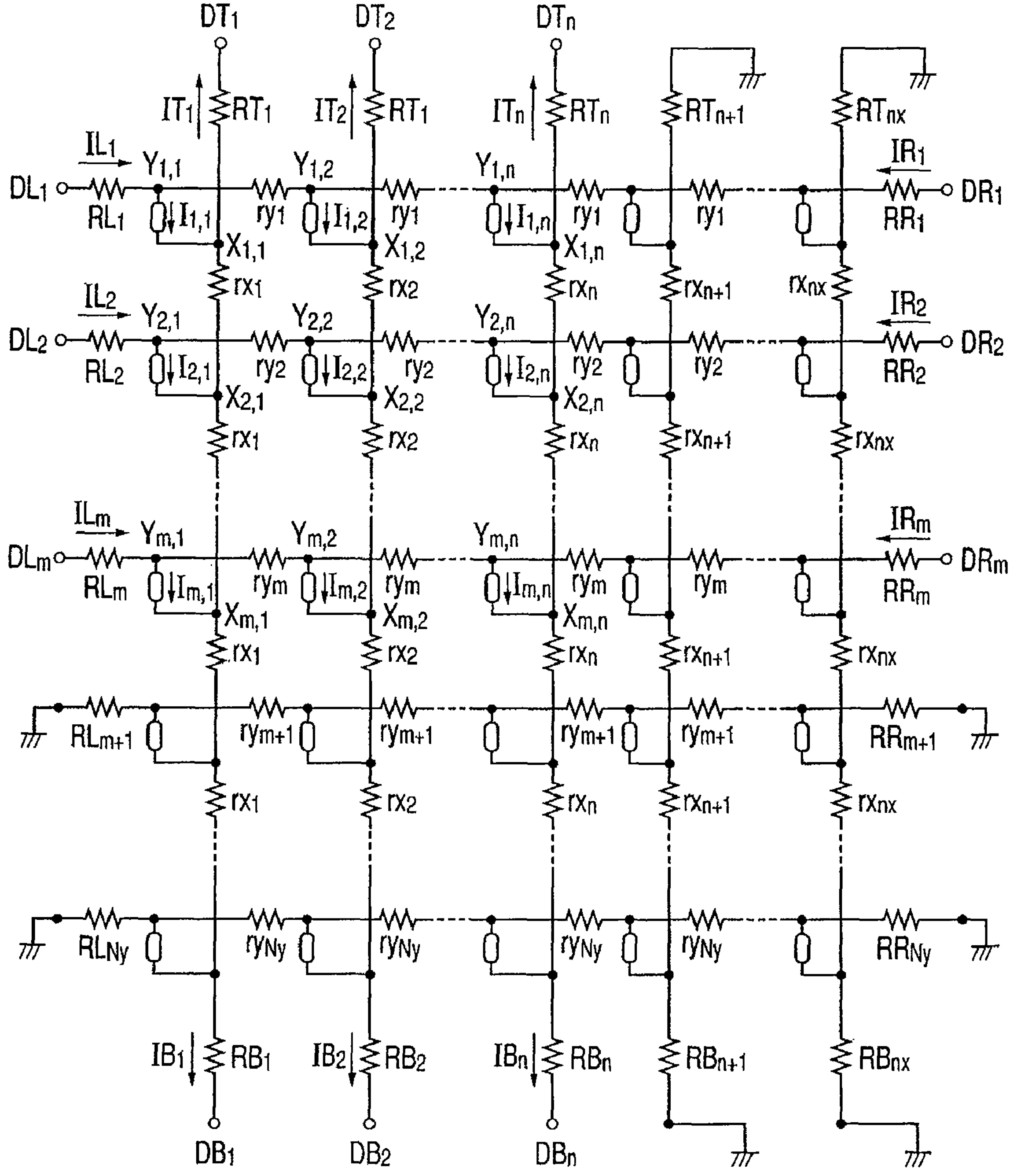
FIG. 6 is an explanatory circuit diagram showing a matrix network to which the present invention is applicable.

An example of a network in which the nonlinear devices are connected in matrix is shown in FIG. 6.

FIG. 6 shows an example of a matrix circuit in which Ny row wirings and Nx column wirings are arranged in a cross shape and the nonlinear device to which the present invention is applicable is connected between a row wiring and a column wiring at each of intersections. In FIG. 6, terminal voltages DL1 to DLm and DR1 to DRm, each of which is equal to or smaller than the threshold voltage V-th of the nonlinear device are provided to first to m-th row wirings and terminals of the remaining (m+1)-th to Ny row wirings are grounded. Terminal voltages DT1 to DTn and DB1 to DBn, each of which is equal to or larger than—V-th are provided to first to n-th column wirings and terminals of (n+1)-th to Nx column wirings are grounded. The terminal voltages are selected such that a voltage equal to or larger than V-th is applied to a nonlinear device located at each of the intersections between the first to m-th row wirings and the first to n-th column wirings to which voltages are selectively applied. At this time, a node current flows into a selected device. Reference symbols $I_{i,j}$ denotes a node current in the case where a sign of a current flowing from a row wiring side node to a column wiring side node at an intersection of i-th row and j-th column is assumed to be positive. Reference symbols DLi and DRi denote wiring currents in the case where a direction of a current flowing into a selected i-th row wiring is assumed to be positive and DTj and DBj denote wiring currents in the case where a direction of a current flowing from a selected j-th column wiring is assumed to be positive. Reference symbol $Y_{i,j}$ denotes a node potential on a row wiring at a node of i-th row and j-th column and $X_{i,j}$ denotes a node potential on a column wiring at the node of i-th row and j-th column. Reference symbol ryi denotes a resistance element of an i-th row wiring and rxj denotes a resistance element of a j-th column wiring. Reference symbol RLi denotes a resistance of the i-th row wiring between one of voltage applying terminals and a node adjacent thereto and RRi denotes a resistance of the i-th row wiring between the other of the voltage applying terminals and a node adjacent thereto. Reference symbol RTj denotes a resistance of the j-th column wiring between one of voltage applying terminals and a node adjacent thereto and RBj denotes a resistance of the j-th column wiring between the other of the voltage applying terminals and a node adjacent thereto.

The above-mentioned network is a matrix network including a non-selective portion. However, when an absolute value of each of voltages applied to a row wiring terminal and a column wiring terminal is equal to or smaller than the threshold voltage of a nonlinear device, a current flowing into a non-selected device can be substantially neglected. Therefore, it is possible to perform the node current estimation based on the wiring currents, so that the node potential estimating method is applicable. At this time, Numerical Expression 25 or Numerical Expression 26 can be used for the method of estimating the node currents.

FIG. 6 shows the example of the circuit in which the devices to which the voltages equal to or larger than V-th are applied are successively selected in a row direction and a column direction. According to the calculation method in the present invention, the wirings may be discontinuously selected. In such a case, a calculation method based on, for example, Numerical Expressions 16 or Numerical Expressions 19 as described earlier may be used.

Figure 7:
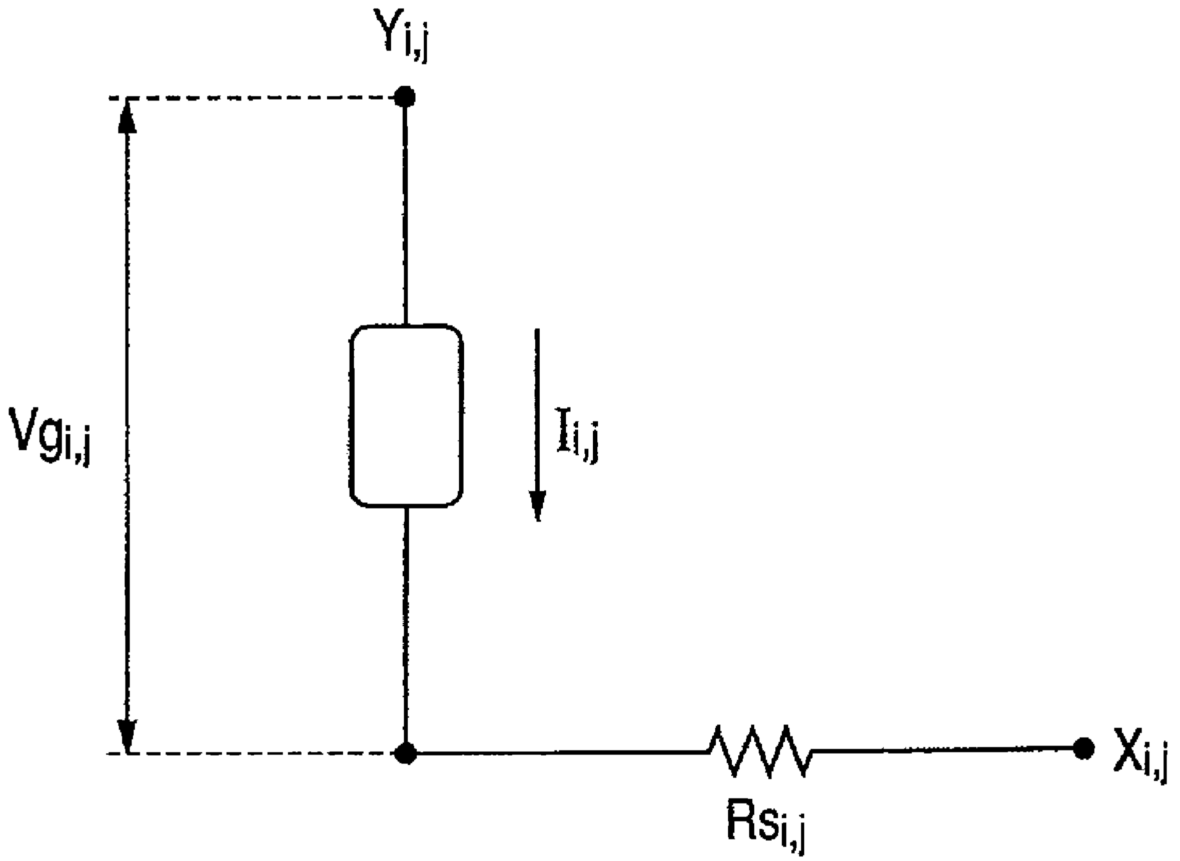
FIG. 7 is an explanatory circuit diagram showing a unit device to which the present invention is applicable.

As shown in FIG. 7, the nonlinear device to which the present invention is applicable and a node resistor $Rs_{i,j}$ having a linear resistance component are connected in series between a node of i-th row and j-th column on the i-th row wiring and a node of i-th row and j-th column on the j-th column wiring. In such a case, a voltage $Vg_{i,j}$ effectively applied to the nonlinear device to which the present invention applicable can be calculated by the following expression based on the node potential $Y_{i,j}$ on the row wiring, the node potential $X_{i,j}$ on the column wiring, and the node current $I_{i,j}$.

$$Vg_{i,j}=Y_{i,j}-X_{i,j}-Rs_{i,j}I_{i,j}$$

As described above, according to the present invention, it is possible to provide a drive method of speedily estimating a quantity of voltage drop caused by wiring resistance with high precision using the node potential calculating method and making compensation for the quantity thereof to drive the circuit. In addition, according to the present invention, an electron source manufacturing method and an electron source manufacturing apparatus can be provided using the drive method.

Hereinafter, a drive method, an electron source manufacturing method using the drive method, and an electron source manufacturing apparatus using the drive method according to embodiments of the present invention will be described in detail.

First Embodiment

Figure 8:
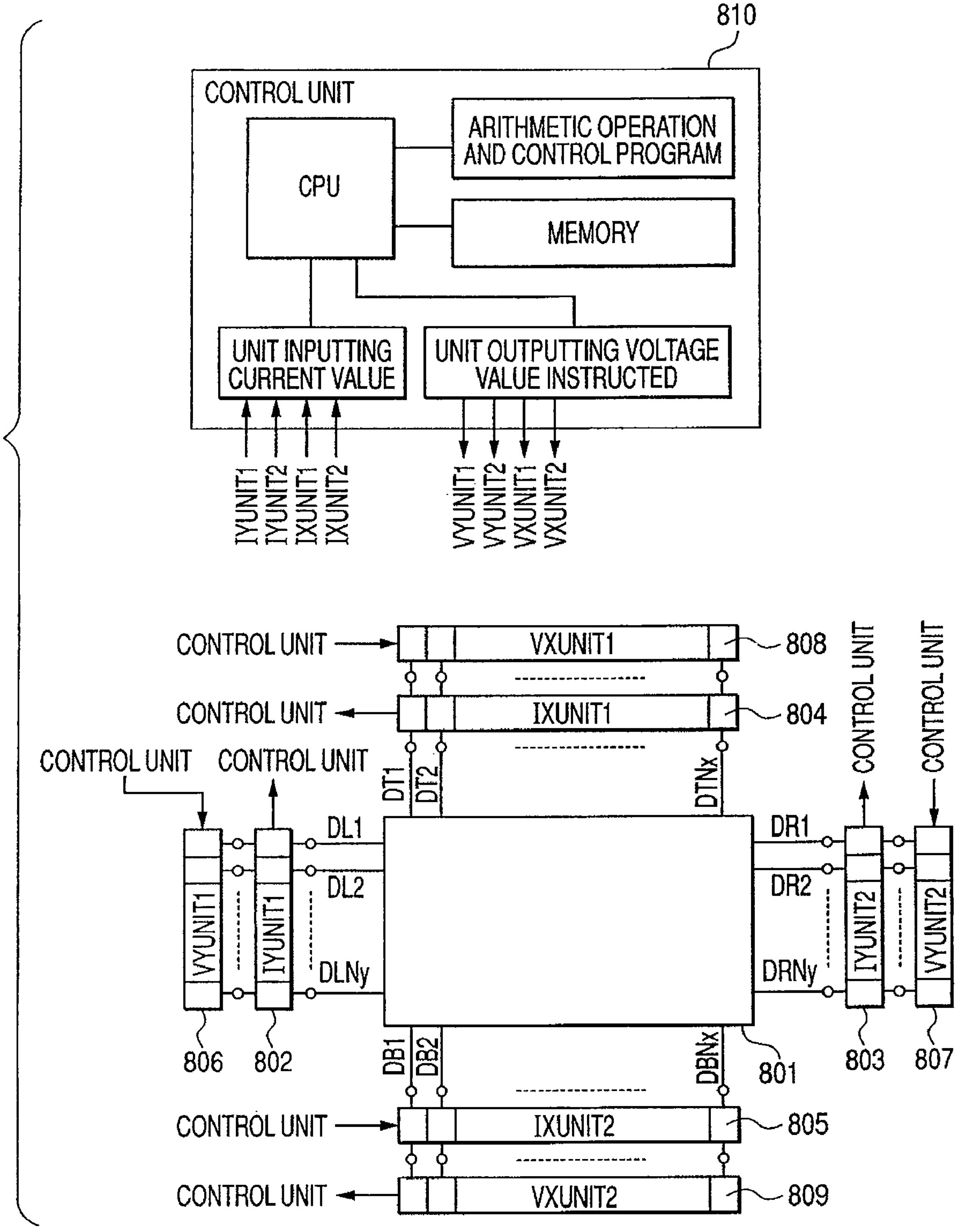
FIG. 8 is a schematic explanatory diagram showing a manufacturing apparatus according to First Embodiment of the present invention.

FIG. 8 shows an electron source manufacturing apparatus according to First Embodiment of the present invention. FIG. 8 is a schematic diagram showing a drive apparatus for performing an energization activation operation on an electron source using surface conduction electron-emitting devices. In FIG. 8, an electron source substrate 801 includes surface conduction electron-emitting devices which are connected in matrix through Ny row wirings and Nx column wirings. Row wiring current measuring means (IYUNIT1 and IYUNIT2) 802 and 803 measure currents flowing through the respective row wirings. Column wiring current measuring means (IXUNIT1 and IXUNIT2) 804 and 805 measure currents flowing through the respective column wirings. First potential applying means (VYUNIT1 and VYUNIT2) 806 and 807 generate voltages applied to the respective row wiring terminals DL1 to DLNy and DR1 to DRNy through the row wiring current measuring means 802 and 803. Second potential applying means (VXUNIT1 and VXUNIT2) 808 and 809 generate voltages applied to the respective column wiring terminals DT1 to DTNx and DB1 to DBNx through the row wiring current measuring means 804 and 805. A control unit 810 serves as an applied-potential calculating means.

The first potential applying means VYUNIT1 and VYUNIT2 and the second potential applying means VXUNIT1 and VXUNIT2 perform the selection of wirings to which voltages are applied and the generation of an applied voltage pattern in response to an instruction value from a voltage instruction value outputting unit of the control unit 810. The row wiring current measuring means IYUNIT1 and IYUNIT2 and the column wiring current measuring means IXUNIT1 and IXUNIT2 measure current values flowing through corresponding wiring terminals and send results obtained by measurement to a current value inputting unit of the control unit 810. A CPU of the control unit 810 calculates terminal voltage instruction values by the drive method in the present invention based on, for example, respective wiring current information, wiring resistance information which is obtained in advance and stored in a memory, and applied voltage target values effectively applied to the respective devices and outputs the calculated terminal voltage instruction values to the voltage instruction value outputting unit. The control unit 810 also has a function of sending control signals to the respective units such that instruction voltages are applied to a target wiring group at a suitable timing.

When the energization activation operation is performed on the electron source using the surface conduction electron-emitting devices, it is preferable that at least a substrate surface on which the electron-emitting devices are formed be maintained in a state in which activation materials are provided to the electron-emitting devices. An example of the state in which activation materials are provided includes, for example, a reduced-pressure atmosphere mainly containing hydrocarbon.

Therefore, the electron source manufacturing apparatus according to this embodiment includes a sealed mechanism, a vacuum pump, and an activation material introducing mechanism, which are not shown.

Next, a voltage applying method used for the energization activation operation in this embodiment will be described.

In this embodiment, the Ny (=768) row wirings in total are classified into a plurality of groups and a plurality of row wirings are assigned to each of the groups. Table 1 shows an example of the assignment of the row wirings to each of the groups.

TABLE 1

| Group | The number of row wirings: m | Row wiring number No.: $S_1, S_2, \ldots, S_{48}$ |
|---|---|---|
| GRP01 | 48 | 1, 17, 33, . . . , 737, 753 |
| GRP02 | 48 | 2, 18, 34, . . . , 738, 754 |
| . . . | . . . | . . . |
| GRP16 | 48 | 16, 32, 48, . . . , 752, 768 |

As shown in Table 1, (h+k×16)-th (k=0, 1, . . . , 47) row wirings are included in an h-th group. The number of row wirings included in each of the groups is m (=48) and row wiring numbers of the row wirings included in a group are $S_1$ to $S_m$.

A voltage pattern applied to terminal groups will be described with reference to FIG. 9.

First, a first pulse voltage pattern associated with the respective row wirings which are included in the group GRP01 and indicated by the row wiring numbers $S_1$ to $S_m$ is applied to terminals $DL_{s1}$ to $DL_{sm}$ and $DR_{s1}$ to $DR_{sm}$ provided in the row wirings. Each of potentials at terminals provided in row wirings other than the row wirings included in the group GRP01 is set to zero. In synchronization with this application, a second pulse voltage pattern associated with respective Nx (=3840) column wirings is applied to each of terminals provided in the column wirings. Next, a first pulse voltage pattern associated with the respective row wirings which are included in the group GRP02 and indicated by the row wiring numbers $S_1$ to $S_m$ is applied to terminals $DL_{s1}$ to $DL_{sm}$ and $DR_{s1}$ to $DR_{sm}$ provided in the row wirings. Each of potentials at terminals provided in row wirings other than the row wirings included in the group GRP02 is set to zero. In synchronization with this application, a second pulse voltage pattern associated with respective column wirings is applied to each of terminals provided in the column wirings. Such an operation is continuously executed for each of the groups. After the voltage application for all the groups passes, the voltage application performed in the above-mentioned procedure is repeated until the activation operation is completed.

The voltage levels of an applied pulse is determined by the drive method in the present invention as described below and renewed at any time. When the voltage levels of the applied pulse is to be renewed, a current value measured before a renewal timing is used.

Figure 10:
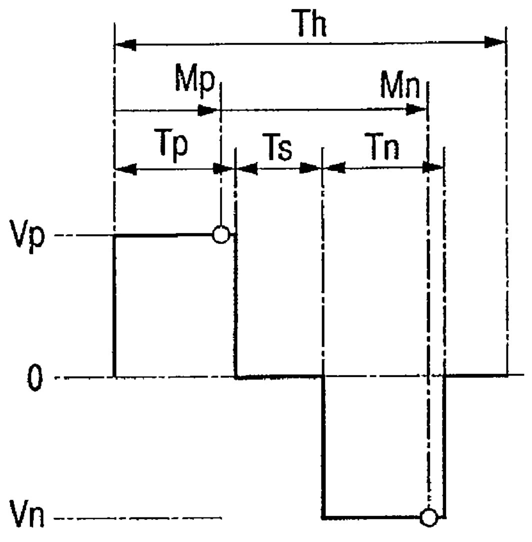
FIG. 10 is a schematic explanatory diagram showing a voltage waveform unit in First Embodiment of the present invention.

An applied voltage pattern in this embodiment has a bipolar pulse voltage waveform as a unit. FIG. 10 is a schematic view showing the pulse voltage waveform as a unit. As shown in FIG. 10, the pulse voltage waveform includes a pulse whose amplitude is Vp and pulse width is Tp and a pulse whose amplitude is Vn having polarity different from that of Vp and pulse width is Tn. The two pulses are arranged at an interval of Ts. Wiring current measurement is performed during each of periods for which the pulses having the respective polarities are being applied. Timings for the wiring current measurement performed during the periods are set to times Mp and Mn measured from a start time of the pulse voltage waveform as a unit. The pulse amplitudes Vp and Vn are set to values associated with each of the terminals. The pulse widths Tp and Tn, the interval Ts, and the times Mp and Mn are not changed.

Next, applied voltage calculation expressions based on the present invention will be described. Numerical Expressions 27 are expressions for calculating voltages applied to row wiring terminals of a group of this embodiment and Numerical Expressions 28 are expressions for calculating voltages applied to column wiring terminals of the group of this embodiment.

$$DL_{Si} = V_{dst} + RL_{Si} \cdot IL_{Si} + \sum_{k=1}^{m} P_{i,k} \cdot ILU_{Sk} \qquad 27$$

$$DR_{Si} = V_{dst} + RR_{Si} \cdot IR_{Si} + \sum_{k=1}^{m} P_{i,k} \cdot IRU_{Sk}$$

$$DT_j = -RT_j \cdot IT_j - \sum_{k=1}^{Nx} ITU_k \cdot Q_{k,j} \qquad 28$$

$$DB_j = -RB_j \cdot IB_j - \sum_{k=1}^{Nx} IBU_k \cdot Q_{k,j}$$

In Numerical Expressions 27 and Numerical Expressions 28.

$$ILU_{Sk} = \frac{2}{n} IL_{Sk},\ IRU_{Sk} = \frac{2}{n} IR_{Sk}$$

$$ITU_k = \frac{2}{m} IT_k,\ IBU_k = \frac{2}{m} IB_k$$

$$\begin{aligned} P_{i,k} &= \frac{rx_{ave}^2}{Rx_{ave}} (S_{\min(i,k)} - 1)(Ny - S_{\max(i,k)}) \\ &= \frac{Rx_{ave}}{(Ny-1)^2} (S_{\min(i,k)} - 1)(Ny - S_{\max(i,k)}) \end{aligned}$$

$$\begin{aligned} Q_{k,j} &= \frac{ry_{ave}^2}{Ry_{ave}} (\min(k, j) - 1)(Nx - \max(k, j)) \\ &= \frac{Ry_{ave}}{(Nx-1)^2} (\min(k, j) - 1)(Nx - \max(k, j)) \end{aligned}$$

Reference symbol Vdst denotes a voltage level effectively applied to each device with respect to a pulse of corresponding polarity. Reference symbol $RL_{si}$ denotes a resistance between one end of an Si-th row wiring and one of voltage applying terminals and $RR_{si}$ denotes a resistance between the other end of the Si-th row wiring and the other of the voltage applying terminals. Reference symbols $IL_{si}$ and $IR_{si}$ denote wiring currents in the case where a direction of currents flowing into the Si-th row wiring, which are measured in advance is positive. Reference symbol $RT_j$ denotes the resistance between one end of the j-th column wiring and one of voltage applying terminals, $RB_j$ denotes the resistance between the other end of the j-th column wiring and the other of the voltage applying terminals, and $rx_j$ denotes a subsidiary node resistance element of the j-th column wiring. Reference symbols $IT_j$ and $IB_j$ denote wiring currents in the case where a direction of currents flowing from the j-th column wiring, which are measured in advance is positive. Reference symbol $Rx_{ave}$ denotes an average of resistance values other than resistance values of end portions of all column wirings and $rx_{ave}$ denotes an average subsidiary node resistance element value of a column wiring, which is a value obtained by dividing $Rx_{ave}$ by (Ny−1). Reference symbol $Ry_{ave}$ denotes an average of resistance values other than resistance values of end portions of row wirings included in a group of interest and $ry_{ave}$ denotes an average resistance element value of a row wiring included in the group, which is a value obtained by dividing $Ry_{ave}$ by (Nx−1).

Voltages applied to column wiring terminals of the group of interest are expressed by Numerical Expressions 27. In Numerical Expressions 27, the first term indicates an instruction value of a voltage effectively applied to each device and the second term is a term for correcting voltage drop caused in column wiring end portions (lead portions). The third term is a term for correcting voltage drop caused by column wiring resistance element and corresponds to the case where the terminal potentials and the resistances of the wiring end portions are assumed to be zero in Numerical Expression 17 and Numerical Expressions 19. A reason why the terminal potentials are assumed to be zero is to extract only a quantity of voltage drop caused by resistance element. A reason why the resistances of the column wiring lead portions are assumed to be zero is to provide a term for correcting voltage drop caused in the column wiring lead portions for row wiring portions to which voltages are applied.

Voltages applied to the respective column wiring terminals are expressed by Numerical Expressions 28. In Numerical Expressions 28, the first term is a term for correcting voltage drop caused by wiring resistance between one end of the column wiring and one of voltage applying terminals. The second term is a term for correcting voltage drop caused by row wiring resistance element and corresponds to the case where the terminal potentials and the resistances of the wiring end portions are assumed to be zero in Numerical Expression 17 and Numerical Expressions 21.

As described above, the electron source manufacturing method and the electron source manufacturing apparatus according to First Embodiment of the present invention, a quantity of voltage drop caused by wiring resistance can be compensated with high precision during the activation process. Therefore, it is possible to make voltages effectively applied to respective devices uniform. An error between a potential distribution actually applied to wiring terminals and a potential distribution calculated by the calculation method in the present invention is caused due to current measurement precision, output precision of the voltage applying means, calculation precision of a computer, and the like. However, when the error is in a range of −3% to +3%, even electron emission characteristics are obtained.

Therefore, the electron emission characteristics are made even. Thus, a preferable image in which ununiformity in luminance is small can be displayed on an image display apparatus produced using an electron source having such electron emission characteristics.

Second Embodiment

Figure 11:
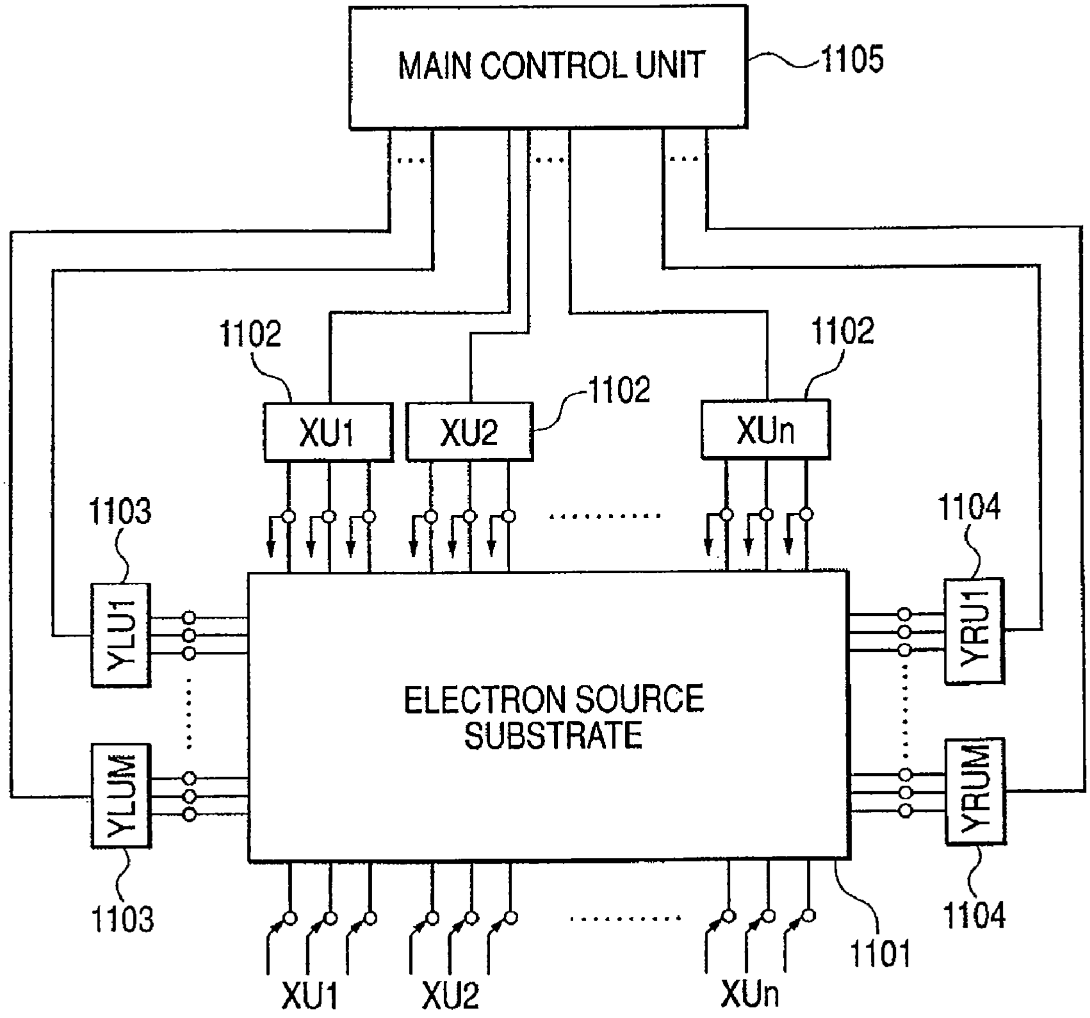
FIG. 11 is a schematic explanatory diagram showing a manufacturing apparatus according to Second Embodiment of the present invention.

FIG. 11 shows an electron source manufacturing apparatus according to Second Embodiment of the present invention. As in the case of First Embodiment, Second Embodiment describes a manufacturing method and a manufacturing apparatus for performing an energization activation operation on an electron source including a plurality of electron-emitting devices which are connected in matrix. In FIG. 11, an electron source substrate 1101 includes surface conduction electron-emitting devices which are connected in matrix through Ny (=1080) row wirings and Nx (=5760) column wirings. Row wiring control units (YLU1, YLU2, . . . , YLUM) 1103 and (YRU1, YRU2, . . . , YRUM) 1104 are provided corresponding to respective voltage applying terminals of row wirings. Each of the row wiring control units handles a plurality of row wirings and controls the corresponding row wirings. The row wiring control unit 1103 controls one terminal of each of the row wirings and the row wiring control unit 1104 controls the other terminal of each of the row wirings. Each of the row wiring control units 1103 and 1104 includes row wiring current measuring means, first potential applying means, and an applied-potential calculating means. Each of column wiring control units (XU1, XU2, . . . , XUn) 1102 handles a plurality of column wirings and controls the corresponding column wirings. Although a single control terminal is provided in each of the column wiring control units for the corresponding column wirings, each control terminal is divided into two branches, which are connected to both terminals of a column wiring. Each of the column wiring control units 1102 includes column wiring current measuring means, second potential applying means, a potential level setting means, node potential calculating means, a node resistance calculating means, and an applied-potential calculating means. A main control unit 1105 performs, for example, data communications with the row wiring control units 1103 and 1104 and the column wiring control units 1102 and timing controls thereof. The main control unit 1105 includes node potential calculating means.

As in the case of First Embodiment, the electron source manufacturing apparatus according to Second Embodiment includes a mechanism for supplying an activation material to the electron source.

As in the case of First Embodiment, according to Second Embodiment, when the energization activation operation is to be performed, the row wirings are classified into a plurality of groups. A first pulse voltage is applied to one of the plurality of groups. A second pulse voltage is applied to each of the column wirings in synchronization with the application of the first pulse voltage. Table 2 shows an example of the assignment of the row wirings to each of the groups in Second Embodiment.

TABLE 2

| Group | The number of row wirings: m | Row wiring number No.: $S_1, S_2, \ldots, S_{60}$ |
|---|---|---|
| GRP01 | 60 | 1, 2, . . . , 60 |
| GRP02 | 60 | 61, 62, . . . , 120 |
| . . . | . . . | . . . |
| GRP18 | 60 | 1021, 1022, . . . , 1080 |

As shown in Table 2, m (=60) successive row wirings are included in each of the groups.

Figure 9:
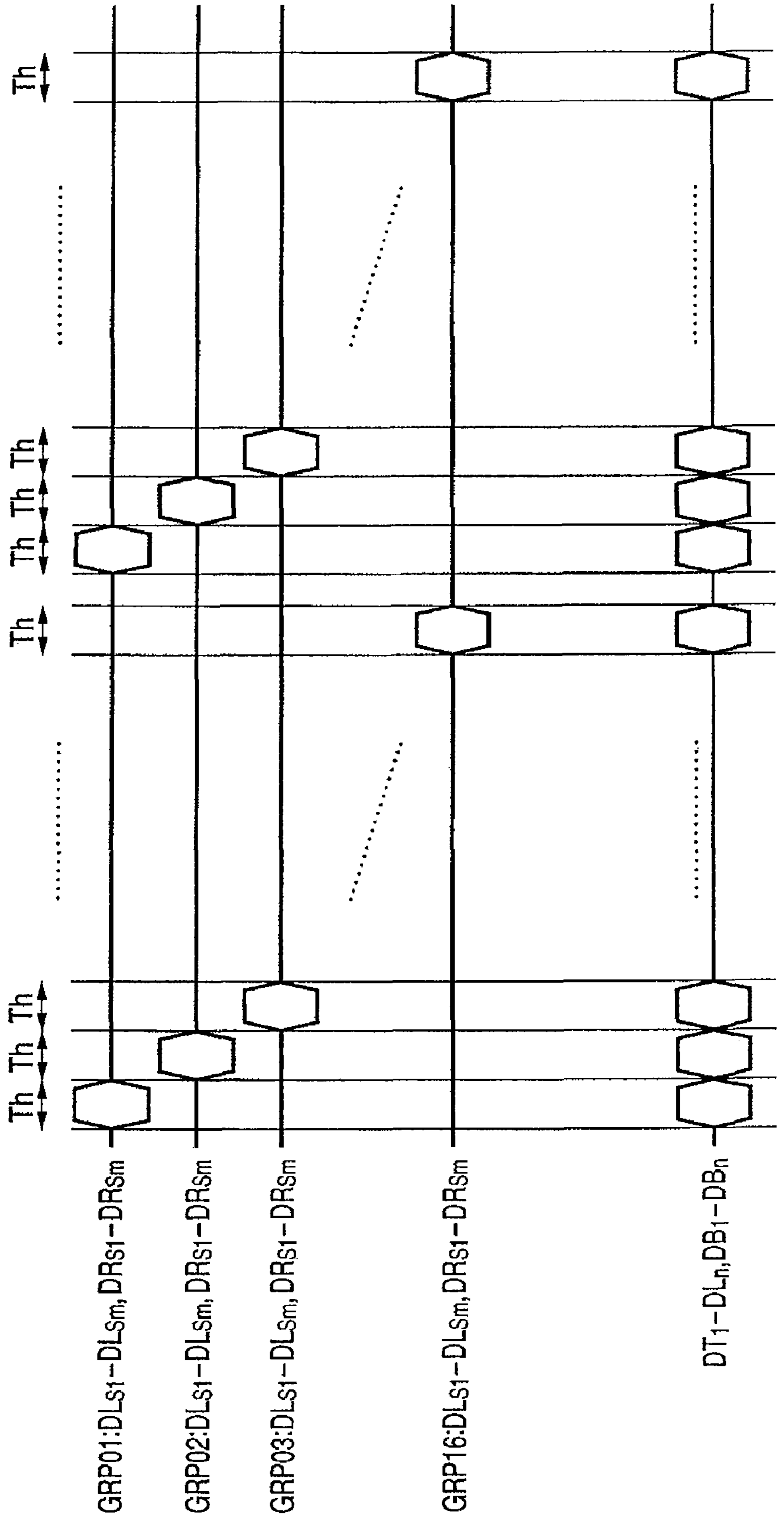
FIG. 9 is a schematic explanatory diagram showing a voltage application timing in First Embodiment of the present invention.

A voltage pattern applied to terminal groups of the row wirings and terminal groups of the column wirings is shown in FIG. 9 and thus identical to that in First Embodiment.

Figure 12:
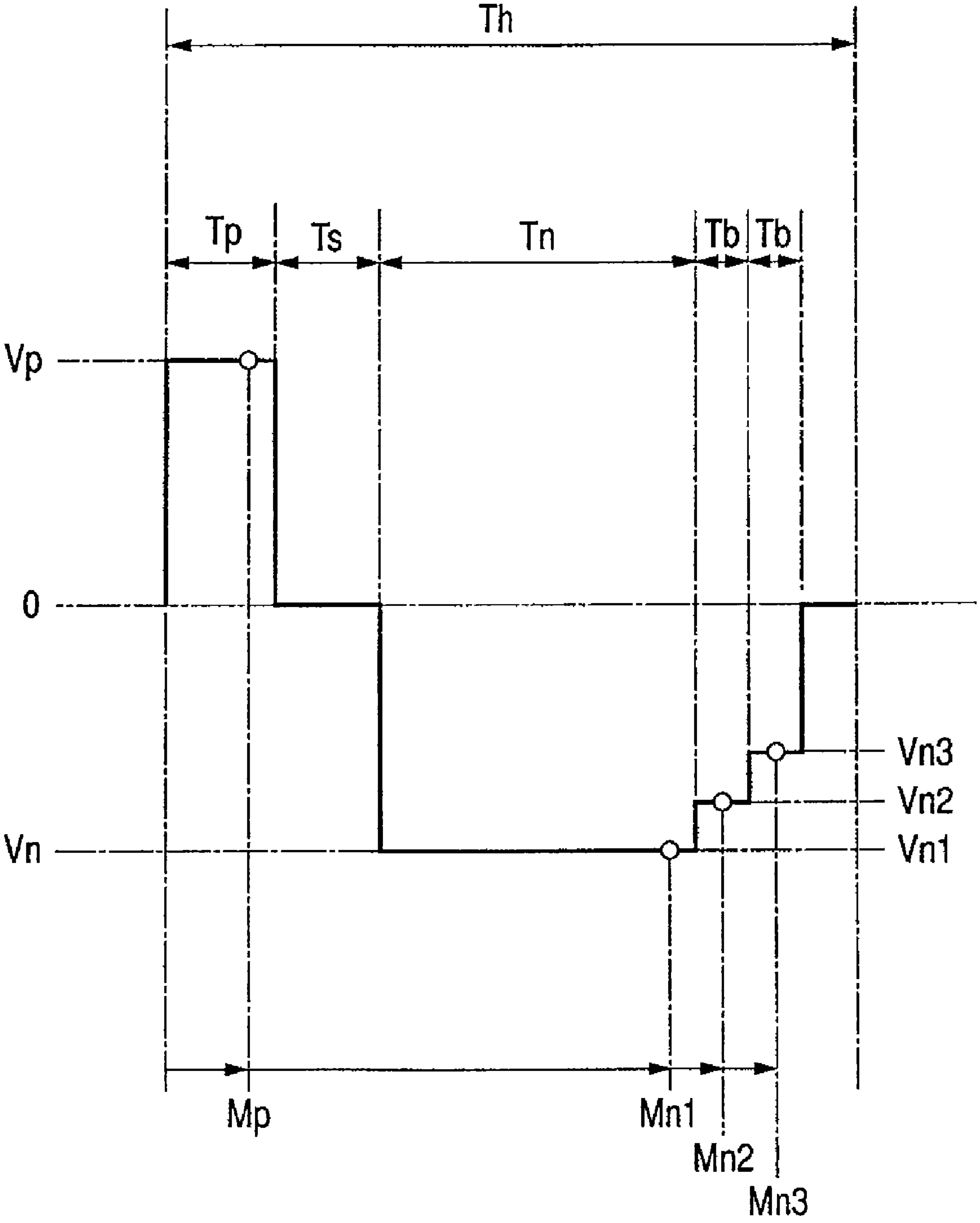
FIG. 12 is a schematic explanatory diagram showing a voltage waveform unit in Second Embodiment of the present invention.

An applied voltage pattern in this embodiment has a bipolar pulse waveform as a unit. FIG. 12 is a schematic view showing the pulse voltage waveform as a unit. As shown in FIG. 12, the pulse voltage waveform includes a pulse whose voltage level is Vp and whose pulse width is Tp and a pulse whose polarity is different from that of Vp and which has different voltage levels of L steps (three steps in FIG. 12).

Next, an electrical characteristic of a device to which the present invention is preferably applied in this embodiment will be briefly described with reference to FIG. 7 and FIGS. 13A and 13B. FIG. 7 shows the device on the electron source substrate having the matrix connection arrangement, to which the present invention is preferably applied in this embodiment. The device is indicated by electrical symbols. In FIG. 7, the device through which the node current $I_{i,j}$ flows and to which the present invention is preferably applied in this embodiment and a linear resistor having a resistance value $Rs_{i,j}$ are located between the node potential $Y_{i,j}$ on the row wiring at the node of i-th row and j-th column and the node potential $X_{i,j}$ on the column wiring at the node of i-th row and j-th column. The device and the linear resistor are connected in series. When a voltage applied between nodes on the row and column wirings at an intersection thereof (to a matrix intersection) is expressed by Vf, the voltage $Vg_{i,j}$ effectively applied to the device to which the present invention is preferably applied in this embodiment is expressed by the following expression.

$$Vg_{i,j}=Vf_{i,j}-Rs_{i,j}\times I_{i,j}=Y_{i,j}-X_{i,j}-Rs_{i,j}\times I_{i,j}$$

Figure 13A:
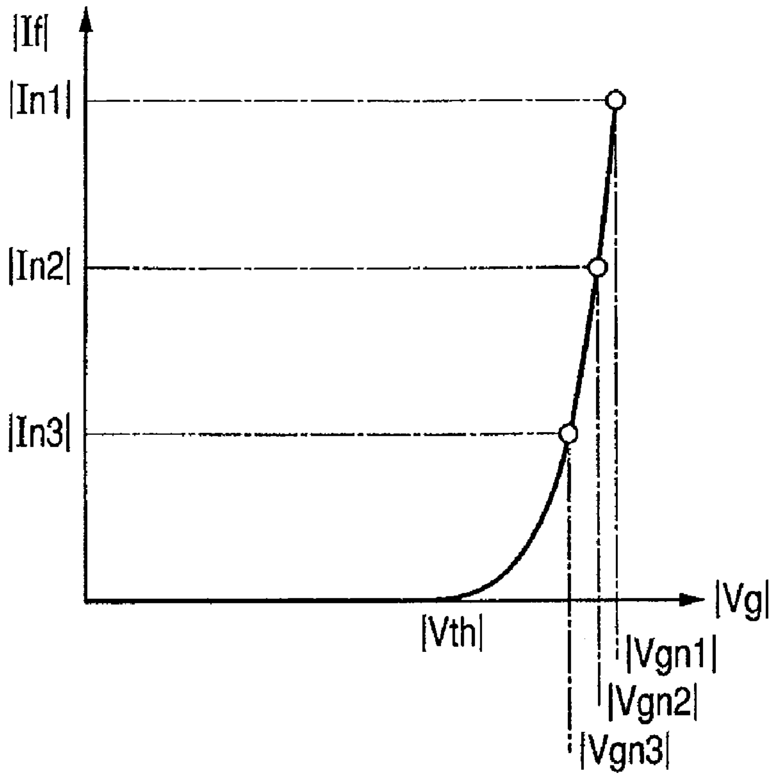
FIGS. 13A and 13B are schematic graphs showing a voltage-current characteristic of a nonlinear device used for a network to which the present invention is applicable.

FIG. 13A is a schematic graph showing a relationship between a voltage Vg effectively applied to a device located in each matrix intersection and a current If flowing through the device (node current). Because a polarity sign is changed according to a reference potential and a flowing direction of the current which are set, absolute values are used for the graph. As shown in FIG. 13A, the device to which the present invention is preferably applied is a nonlinear device in which a current significantly flows when a voltage equal to or larger than the threshold voltage V-th is applied thereto. FIG. 13B is a plot showing an electrical characteristic of the device, in which the abscissa indicates 1/Vg and the ordinate indicates log ($If/Vg^2$). Hereinafter, the plot of the form shown in FIG. 13B is referred to as a Fowler-Nordheim plot or a FN plot.

Figure 13B:
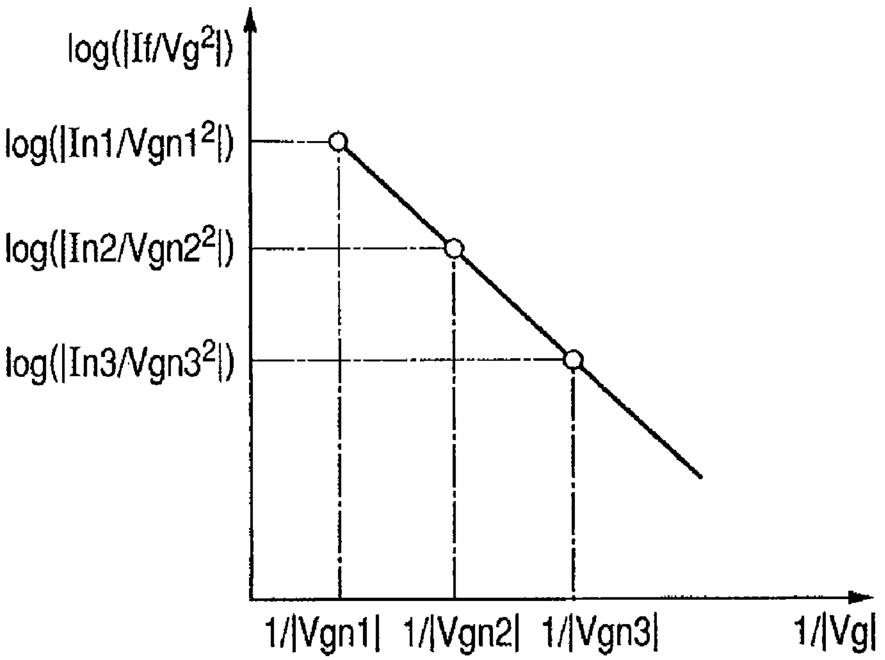

In the pulse waveform shown in FIG. 12, when voltages effectively applied to the device, which correspond to Vn1 (=Vn) to VnL (=Vn3) are expressed by Vgn1 to VgnL (=Vgn3) and node currents corresponding the voltages are expressed by In1 to InL (=In3), the relationship between the voltages and the node currents is shown in FIGS. 13A and 13B. In particular, according to the FN plot as shown in FIG. 13B, the electrical characteristic of the device to which the present invention is preferably applied in this embodiment becomes substantially linear.

In this embodiment, a relationship between the current I and the effective voltage Vg is expressed by the following expression using coefficients A and B based on the above-mentioned electrical characteristic.

$$I = A(B\cdot Vg)^2\exp\left(-\frac{1}{B\cdot Vg}\right) \quad 29$$

The coefficient B is referred to as a field conversion coefficient proportional term. In this embodiment, the following expression based on a least-squares method is used to estimate the field conversion coefficient proportional term B from a series of a plurality of voltage levels $Vg_1, Vg_2, \ldots, Vg_L$ and a series of current measurement values $I_1, I_2, \ldots, I_L$ and corresponding thereto.

$$B_{est} = \frac{\left(\sum_{k=1}^{L}\frac{w_k}{Vg_k}\right)^2 - \left(\sum_{k=1}^{L}w_k\right)\left(\sum_{k=1}^{L}\frac{w_k}{Vg_k^2}\right)}{\left(\sum_{k=1}^{L}w_k\right)\left(\sum_{k=1}^{L}\frac{w_k}{Vg_k}\log\left(\frac{I_k}{Vg_k^2}\right)\right) - \left(\sum_{k=1}^{L}\frac{w_k}{Vg_k}\right)\left(\sum_{k=1}^{L}w_k\log\left(\frac{I_k}{Vg_k^2}\right)\right)} \quad 30$$

where $W_k$ denotes a weighting factor for each of the voltage levels. It is preferable to set the weighting factor in view of statistics and examples thereof are values shown in Table 3.

TABLE 3

| Value of $w_k$ | |
|---|---|
| 1 | When expected value of current measurement error is proportional to current value |
| $I^2_k$ | When expected value of current measurement error is constant value |

Figure 14:
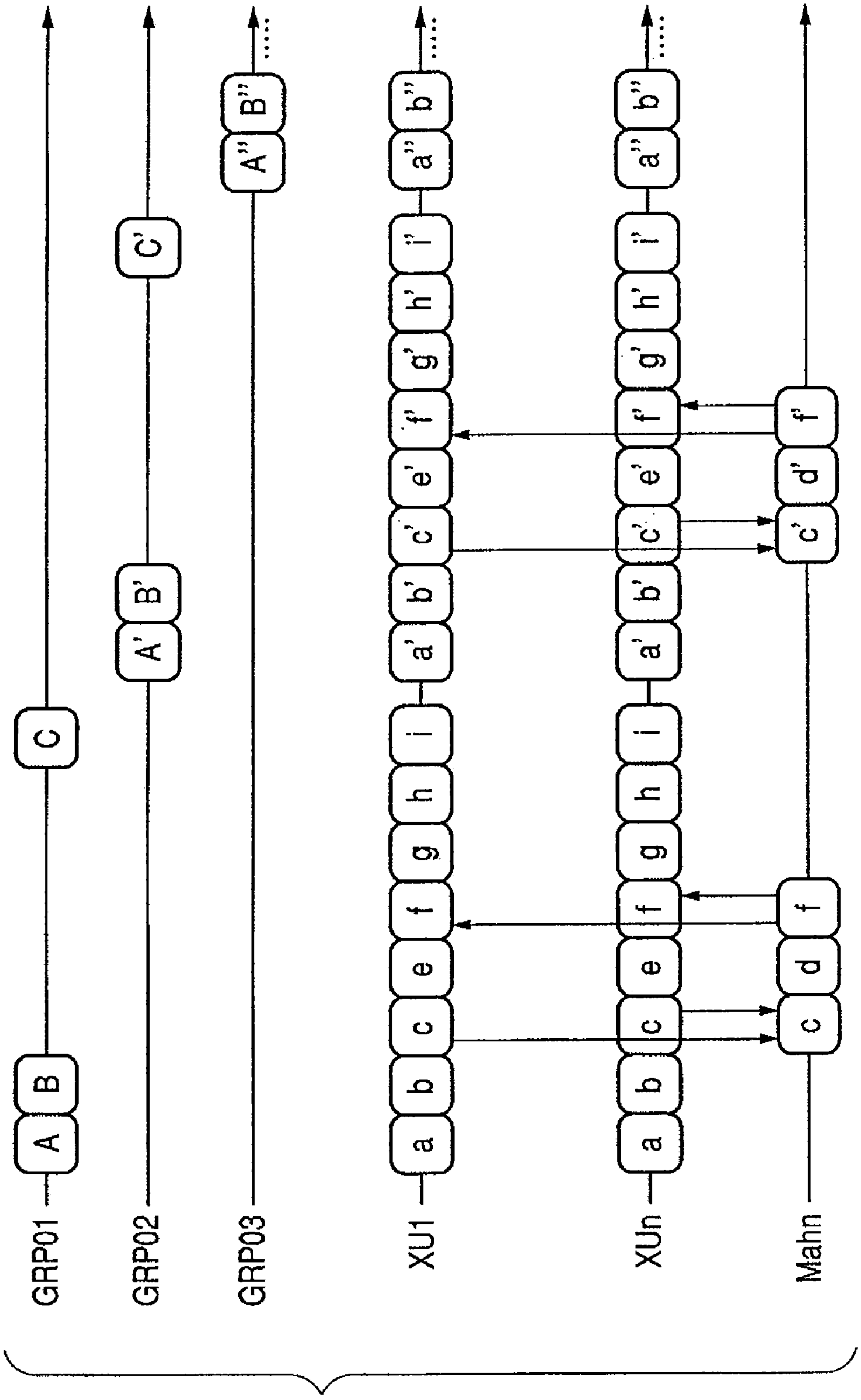
FIG. 14 is a schematic explanatory diagram showing a voltage waveform renewal procedure in Second Embodiment of the present invention.

Next, an example of a series of voltage applying methods in this embodiment will be described with reference to FIGS. 11 and 14.

First, voltage output procedures (A) to (C) of the row wiring control units 1103 and 1104 will be described.

(A) The row wiring control units 1103 and 1104 apply first pulse voltages associated with respective row wiring terminals to m row wirings included in the group GRP01. Each of other row wiring terminals is specified to a zero volt potential. At this time, a waveform of each of the first pulse voltages has a plurality of voltage levels as shown in FIG. 12.

(B) Wiring current values flowing through each of the m row wirings included in the group GRP01 in accordance with each of the voltage levels of an applied pulse voltage waveform are measured. The measured wiring current values are stored in memories of the row wiring control units 1103 and 1104. When the m row wirings included in the group GRP01 are separately handled by a plurality of row wiring control units, the currents flowing through the row wirings included in the group GRP01 are commonly used by communication among row wiring control units or a communication means through the main control unit.

(C) Target values of waveforms of row wiring output pulse voltages, which are to be outputted to the same group next time are set by renewing based on node current values estimated from the measured wiring current values and wiring resistance values. When a voltage level of (L+1) voltage levels which is to be effectively applied to each device is expressed by Vdst, an output voltage level at each of the row wiring terminals which corresponds to the voltage level is determined by, for example, the following expression based on the drive method in the present invention.

$$DL_{Si} = \alpha\cdot V_{dst} + RL_{Si}\cdot IL_{Si} + \sum_{k=1}^{m}P_{i,k}\cdot ILU_{Sk} \quad 31$$

$$DR_{Si} = \alpha\cdot V_{dst} + RR_{Si}\cdot IR_{Si} + \sum_{k=1}^{m}P_{i,k}\cdot IRU_{Sk}$$

Here, α is a coefficient for dividing a target effective applied voltage Vdst into a row wiring side voltage and a column wiring side voltage and set as appropriate. The same symbols as those in Numerical Expressions 27 indicate the same meanings. The third term of each of Numerical Expressions 31 is a term for making compensation for voltage drop caused by row wiring resistance. When a recurrence equation similar to Numerical Expression 20 is used to calculate the third term, a calculation time can be shortened.

Next, voltage output procedures (a) to (i) of the column wiring control units 1102 will be described.

(a) Second pulse voltages associated with respective column wiring terminals are applied to all Nx column wirings in synchronization with pulse voltages applied to the terminals of the row wirings included in the group GRP01. At this time, a waveform of each of the second pulse voltages has a plurality of voltage levels as shown in FIG. 12.

(b) Wiring current values flowing through each of the Nx row wirings in accordance with each of the voltage levels of an applied pulse voltage waveform are measured. In each of n column wiring control units 1102, a current value flowing from a corresponding column wiring thereto is measured for each of the signal levels and stored in an internal memory. Representative values of the currents flowing into the respective column wiring control units (for example, total current values in the units) are calculated as representative node currents $Is_1$ to $Is_n$.

(c) The representative node currents obtained for the respective voltage levels by the column wiring control units 1102 are transmitted to the main control unit 1105.

(d) In the main control unit 1105, representative node potentials on the row wirings are calculated by the node potential calculating method in the present invention based on the representative node currents and representative resistances element of the row wirings in the case where column wirings handled by each of the column wiring control units are represented by a single column wiring and thus all the column wirings are assumed to be n column wirings. At this time, when the calculation expression expressed by the recurrence equation is used, the node potential calculation can be performed in higher speed.

(e) On the other hand, in the column wiring control units 1102, the node current values are estimated using calculation expressions such as Numerical Expression 15 and Numerical Expression 18 or Numerical Expressions 19 and Numerical Expression 20 based on wiring currents associated with the respective column wiring control units. Representative node potentials on the column wirings are calculated by the node potential calculating method in the present invention.

(f) The main control unit 1105 transmits, to the column wiring control units 1102, the representative node potentials on the row wirings, which are obtained by calculation.

(g) In the respective column wiring control units 1102, node potentials on the row wirings at intersections with the column wirings are calculated by polynomial approximation based on the received representative node potentials on the row wirings.

(h) Effective voltage estimation values $Vg_{i,j}^{(1)}$ to $Vg_{i,j}^{(L)}$ of L voltage levels at each of the nodes are calculated by the calculation means of the respective column wiring control units 1102 based on the node potentials $Y_{i,j}^{(1)}$ to $Y_{i,j}^{(L)}$ on the row wirings, the node potentials $X_{i,j}^{(1)}$ to $X_{i,j}^{(L)}$ on the column wirings, the node currents $I_{i,j}^{(1)}$ to $I_{i,j}^{(L)}$, and node resistance estimation values $Rs_{i,j}$, which are calculated for each of the L voltage levels in (e) and (g). Then, a field conversion coefficient proportional term $B_{esti,j}$ is calculated by Numerical Expression 30 and the node resistance estimation values $Rs_{i,j}$ are renewed using the following expression.

$$Rs_{i,j}^{(new)}=R_{i,j}^{(old)}+k(B_{est\,i,j}-B_{dst})$$

Here, Bdst denotes an index of a field conversion coefficient proportional term which is expected by the activation operation. This index is set as appropriate according to a target activation voltage, an activation material, and the like. A set value of the index is about 0.00338 to 0.00508. A coefficient k is a correction coefficient for renewing the node resistance estimation value and suitably set to a value equal to or larger than zero.

(i) Target values of waveforms of column wiring output pulse voltages, which are to be outputted to the same group next time are set by renewing based on the renewed node resistance values, node current values estimated from the wiring currents, and wiring resistance values. When a voltage level of (L+1) voltage levels is expressed by Vdst, an output voltage level $Dx_j$ at a j-th column wiring terminal, which corresponds to the voltage level is determined by, for example, the following expression based on the drive method in the present invention.

$$\begin{aligned} Dx_j &= (\alpha-1)V_{dst} - \frac{1}{4}(RT_j+RB_j)\cdot Ix_j - \sum_{k=1}^{Nx} Ixu_k\cdot Q_{k,j} - Rs_{avej}\cdot Ixu_j \\ &= (\alpha-1)V_{dst} - \frac{1}{4}(RT_j+RB_j)\cdot Ix_j - \frac{1}{m}\sum_{k=1}^{Nx} Ix_k\cdot Q_{k,j} - \frac{1}{m}Rs_{avej}\cdot Ix_j \end{aligned} \tag{32}$$

Here, α is a coefficient for dividing a target effective applied voltage Vdst into a row wiring side voltage and a column wiring side voltage and is equal to a in Numerical Expressions 31. In addition, $Rs_{avej}$ denotes a mean value of the renewed m node resistances $Rs_{i,j}$ of each of the row wirings included in the same group. The same symbols as those in Numerical Expressions 28 indicate the same meanings.

Based on the above-mentioned procedures, target values of waveforms of output pulse voltages which are applied to row wirings and column wirings are renewed for each of the row wiring groups GRP01, GRP02, . . . and pulse voltage waveforms which are to be outputted to the same group next time are reflected by the renewed target values.

As described above, when the energization activation operation is performed during the voltage waveform renewing, the quantity of voltage drop caused by wiring resistance and the quantity of voltage drop caused by node resistance can be compensated with high accuracy. An error between a potential distribution including node potentials calculated by an actual apparatus and potentials applied to wiring terminals and a potential distribution calculated by the calculation method in the present invention is caused due to current measurement precision, output precision of the voltage applying means, calculation precision of a computer, and the like. However, when the error is in a range of −3% to +3%, even electron emission characteristics are obtained. According to the present invention, the node potential calculation and the voltage drop quantity calculation which is an application thereof are performed at high speed by an increase in speed of calculation using the recurrence equation and the division of calculation, so the renewal frequency of the applied voltage waveform can be improved. Therefore, a variation in current caused during the energization activation can be rapidly reduced. Thus, it is possible to make the voltages effectively applied to the respective device more uniform.

Therefore, the electron emission characteristics are made even. Thus, a preferable image in which ununiformity in luminance is small can be displayed on an image display apparatus produced using an electron source having such electron emission characteristics.

Third Embodiment

Figure 15:
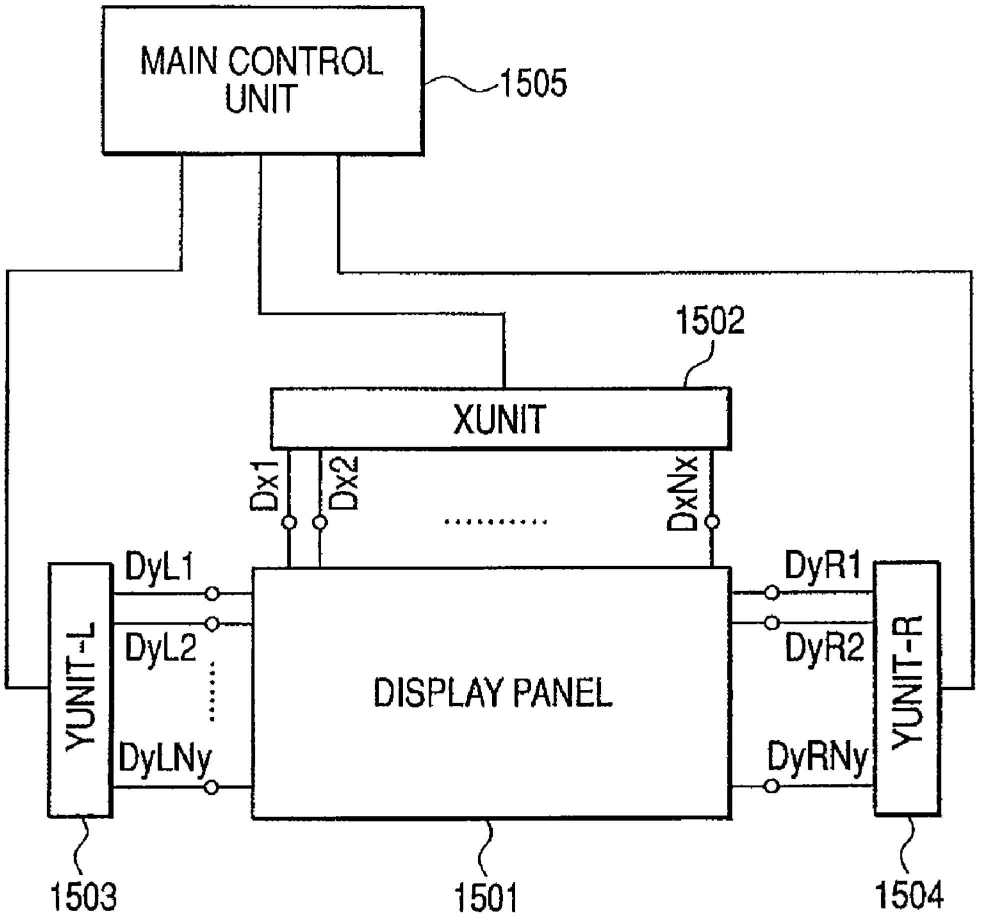
FIG. 15 is a schematic explanatory diagram showing a manufacturing apparatus according to Third Embodiment of the present invention.

FIG. 15 shows an image display apparatus manufacturing apparatus according to Third Embodiment of the present invention. In Third Embodiment, a manufacturing method and a manufacturing apparatus for performing a preparative driving operation on an image display apparatus using an electron source including a plurality of surface conduction electron-emitting devices or a plurality of field emission electron-emitting devices which are connected in matrix will be described.

In FIG. 15, a display panel 1501 composing the image display apparatus includes an electron source in which matrix connection is made through Ny row wirings and Nx column wirings, as a constituent component. Row wiring control units (YUNIT-L and YUNIT-R) 1503 and 1504 are provided corresponding to respective voltage applying terminals of row wirings. Each of the row wiring control units includes row wiring current measuring means for measuring wiring currents flowing into the respective row wirings and first potential applying means for applying a first pulse voltage to each of the row wirings. The row wiring control unit (YUNIT-L) controls one terminal of each of the row wirings and the row wiring control unit (YUNIT-R) controls the other terminal of each of the row wirings. A column wiring control unit (XUNIT) 1502 includes column wiring current measuring means for measuring wiring currents flowing into the respective column wirings and second potential applying means for applying a second pulse voltage to each of the column wirings. In this embodiment, the column wiring control unit is connected to only one connection terminal of each of the column wirings. A main control unit 1505 performs, for example, data communications with the respective row wiring control units 1503 and 1504 and the column wiring control units 1502 and timing controls thereof. The main control unit 1505 includes node potential calculating means.

In this embodiment, during the preparative driving operation, the first pulse voltage is applied to one of the Ny row wirings and the second pulse voltage is applied to each of the column wirings in synchronization with the application of the first pulse voltage. Such an operation is performed on all the row wirings to complete the preparative driving operation.

Figure 16:
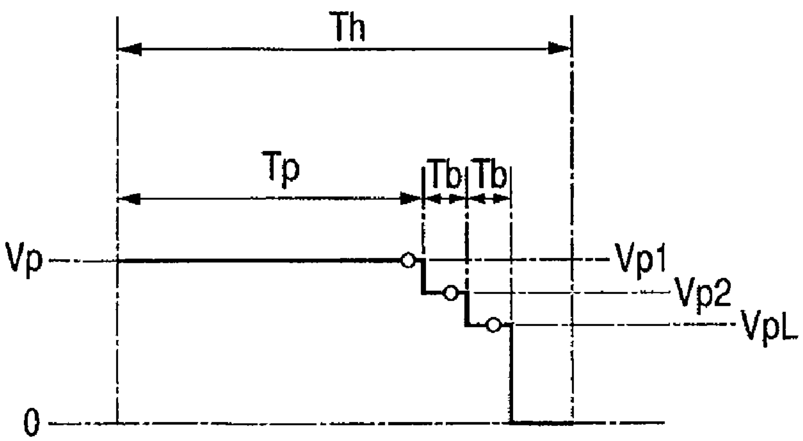
FIG. 16 is a schematic explanatory diagram showing a voltage waveform unit in Third Embodiment of the present invention.

An applied voltage pattern in this embodiment has a unipolar pulse waveform as a unit. FIG. 16 is a schematic diagram showing the pulse voltage waveform as a unit. As shown in FIG. 16, the pulse voltage waveform includes a main pulse whose voltage level is Vp and pulse width is Tp and a pulse which has different voltage levels of L steps, including Vp.

An electrical characteristic of a device to which the present invention is preferably applied in this embodiment is a field emission (Fowler-Nordheim tunneling) characteristic which becomes substantially linear in the FN plot shown in FIG. 13B. This electrical characteristic is expressed by Numerical Expression 29. In the electron source of the image display apparatus manufactured in this embodiment, a device having the field emission characteristic and a linear resistor having a resistance value Rs are connected in series at each matrix intersection.

Next, the voltage level determination of the pulse voltage waveform and the renewal procedure thereof will be described. Hereinafter, assume that with respect to a voltage having a k-th level in i-th row and j-th column, the voltages DL and DR applied to the row wiring terminals, the voltage Dx applied to the column wiring terminal, the node potential Y on the row wiring, the node potential X on the column wiring, the node current I, and the node resistance estimation value Rs are expressed by $DL_i(k)$, $DR_i(k)$, $Dx_i(k)$, $Y_{i,j}(k)$, $X_{i,j}(k)$, $I_{i,j}(k)$, and $Rs_{i,j}$, respectively.

(0) Initial Voltage Application

Only in the case of first voltage application, terminal voltages applied to i-th row wiring terminals are calculated by the following expression.

$$DL_i(k)=DR_i(k)=-\alpha\cdot Vp_k$$

Further, a terminal voltage applied to a j-th column wiring terminal is calculated by the following expression.

$$Dx_j(k)=(1-\alpha)\cdot Vp_k$$

A coefficient "α" is selected such that a relationship between the coefficient and the threshold voltage V-th of the nonlinear device which is a constituent component of the electron source satisfies the following expression.

$$(1-\alpha)Vp<Vth$$

(1) Current Measurement

In synchronization with the application of the pulse voltage, column wiring currents $IL_{i,j}(k)$ and $IR_{i,j}(k)$ and a column wiring current $Ix_{i,j}(k)$, which flow at this time are measured. In this embodiment, the number of row wirings simultaneously driven is one and the voltage applied to the column wiring is equal to or smaller than the threshold voltage of the nonlinear device which is the constituent component of the electron source. Therefore, it is assumed that the column wiring current $Ix_{i,j}(k)$ is substantially equal to the node current $I_{i,j}(k)$.

(2) Calculations of Node Potential and Effective Voltage

The node potentials at each node is calculated. The node potential $Y_{i,j}(k)$ on the row wiring is calculated using the following expressions equivalent to, for example, Numerical Expression 17 and Numerical Expressions 21.

$$Y_{i,j}(k)=DL_i(k)\cdot a_{i,j}+DR_i(k)\cdot b_{i,j}-\sum_{l=1}^{Nx}c_{i,j,l}I_{i,l}(k)$$

$$a_{i,j}=\frac{1}{Ryall_i}\{RR_i+(Nx-j)ry_i\}$$

$$b_{i,j}=\frac{1}{Ry\,all_i}\{RL_i+(j-1)ry_i\}$$

$$c_{i,j,l}=\frac{1}{Ryall_i}\{RL_i+(\min(j,l)-1)ry_i\}\{RR_i+(Nx-\max(j,l))ry_i\}$$

At this time, when the following recurrence equation equivalent to Numerical Expression 22 is used to calculate (Nx−2) node potentials, the calculation time is significantly shortened.

$$Y_{i,j}(k)=2Y_{i,j-1}(k)-Y_{i,j-2}(k)+ry_i\cdot I_{i,j-1}(k)$$

As described above, in order to calculate the node potentials at the Nx nodes, representative node potentials of n smaller than Nx are calculated and subjected to polynomial interpolation for estimation, so that the calculation time is further shortened.

On the other hand, the node potential $X_{i,j}(k)$ on the column wiring can be easily calculated by the following expression.

$$X_{i,j}(k)=(RT_j+(i-1)rx_j)\cdot I_{i,j}(k)$$

Therefore, an effective voltage $Vg_{i,j}(k)$ having a k-th level in i-th row and j-th column is calculated by the following expression.

$$Vg_{i,j}(k)=Y_{i,j}(k)-X_{i,j}(k)-Rs_{i,j}\cdot I_{i,j}(k)$$

(3) Renewal of Node Resistance Estimation Value

The node resistance estimation value is renewed. When an estimation value of field conversion coefficient proportional term for a device located in i-th row and j-th column is expressed by $B_{esti,j}$, the estimation value is calculated by the following equations equivalent to Numerical Expression 30.

$$B_{est\,i,j}=\frac{S_x^2-S_nS_{xx}}{S_nS_{xy}-S_xS_y}$$

$$S_n=\sum_{k=1}^{L}w_{i,j,k},\ S_x=\sum_{k=1}^{L}\frac{w_{i,j,k}}{Vg_{i,j}(k)},\ S_y=\sum_{k=1}^{L}w_{i,j,k}\log\left(\frac{I_{i,j}(k)}{Vg_{i,j}^2(k)}\right)$$

$$S_{xx}=\sum_{k=1}^{L}\frac{w_{i,j,k}}{Vg_{i,j}^2(k)},\ S_{xy}=\sum_{k=1}^{L}\frac{w_{i,j,k}}{Vg_{i,j}(k)}\log\left(\frac{I_{i,j}(k)}{Vg_{i,j}^2(k)}\right)$$

The node resistance estimation value Rs is renewed by the following expression based on the estimation value of field conversion coefficient proportional term $B_{esti,j}$.

$$Rs_{i,j}^{(new)}=R_{i,j}^{(old)}+k(B_{est\,i,j}-B_{dst})$$

Here, Bdst denotes an index of a field conversion coefficient proportional term which is expected by the activation operation. This index is set as appropriate according to a target activation voltage, an activation material, and the like. A set value of the index is about 0.00338 to 0.00508. A coefficient k is a correction coefficient for renewing the node resistance estimation value and suitably set to a value equal to or larger than zero. An initial value of the node resistance estimation value suitably set to, for example, zero or an expected value of the node resistance which is roughly expected.

(4) Renewal of Output Terminal Voltage

The output terminal voltage value is renewed. The terminal voltages applied to the i-th row wiring terminals are calculated by the following expressions equivalent to Numerical Expressions 31, $$DL_i(k)=-\alpha\cdot Vp_k+RL_i\cdot IL_i+(i-1)rx_{ave}\cdot\frac{2\cdot IL_i}{Nx}$$

$$DR_i(k)=-\alpha\cdot Vp_k+RR_i\cdot IR_i+(i-1)rx_{ave}\cdot\frac{2\cdot IR_i}{Nx}$$

and the terminal voltage applied to the j-th column wiring terminal is calculated by the following expression equivalent to Numerical Expression 32.

$$Dx_j(k)=(1-\alpha)\cdot Vp_k-RT_j\cdot Ix_j(k)-\sum_{l=1}^{Nk}Ix_l(k)\cdot c_{i,j,l}-Rs_{i,j}\cdot Ix_j(k)$$

Note that the third term is equal to the third term of the expression used for the node potential calculation on the row wiring in (2). Therefore, when the result obtained by calculation in (2) is used, a calculation load can be significantly reduced.

The above-described procedures of (1) to (4) are repeated. When the application of predetermined pulses is completed, the preparative driving operation is performed for another row wiring. After the preparative driving operation is performed on all the devices composing the electron source, the manufacturing method according to this embodiment is completed.

As described above, according to the image display apparatus manufacturing method and the image display apparatus manufacturing apparatus according to Third Embodiment of the present invention, a quantity of voltage drop caused by wiring resistance and a quantity of voltage drop caused by a node resistance can be compensated with high precision during the preparative driving process. Therefore, it is possible to make voltages effectively applied to respective devices uniform. An error between a potential distribution actually applied to wiring terminals and a potential distribution calculated by the calculation method in the present invention is caused due to current measurement precision, output precision of the voltage applying means, calculation precision of a computer, and the like. However, when the error is in a range of −3% to +3%, even electron emission characteristics are obtained. Therefore, the electron emission characteristics are made even. Thus, a preferable image in which ununiformity in luminance is small can be displayed.

This application claims priority from Japanese Patent Application Nos. 2004-001529 filed on Jan. 6, 2005 and 2005-366555 filed on Dec. 20, 2005 which are hereby incorporated by reference herein.

What is claimed is:

1. A method of manufacturing an image display apparatus including at least one first wiring, a plurality of image display devices connected to the first wiring, and a plurality of second wirings connected to the plurality of image display devices, comprising the steps of:

determining a signal applied to the second wirings; and applying a voltage to portions connected to the first wiring and the second wirings by application of a potential $D_L$ to a first predetermined position of the first wiring, application of a potential $D_R$ to a second predetermined position thereof, and application of the signal to the plurality of second wirings, wherein the determining step includes a step of setting a set value $V_j$ associated with a j-th position of a plurality of n positions, where j and n each are a positive integer, located between the first predetermined position and the second predetermined position on the first wiring, wherein in the setting step, the set value $V_j$ is set by the following expression $$V_j=D_La_j+D_Rb_j-\sum_{k=1}^{n}c_{j,k}I_k$$

where $I_k$ denotes a current quantity flowing from a k-th position of the n positions, wherein when a resistance between the j-th position and a (j+1)-th position on the first wiring is $R_j$, a resistance between a first position and one of the first predetermined position and the second predetermined position which is closer to the first position is $R_0$, a resistance between an n-th position and one of the first predetermined position and the second predetermined position which is closer to the n-th position is $R_n$, and a resistance between the first predetermined position and the second predetermined position is $R_{all}$, $a_j$, $b_j$, and $c_{j,k}$ are expressed by $$a_j = \frac{1}{R_{all}} \sum_{q=j}^{n} R_q$$

$$b_j = \frac{1}{R_{all}} \sum_{p=0}^{j-1} R_p$$

$$c_{j,k} = \frac{1}{R_{all}} \sum_{p=0}^{min(j,k)-1} R_p \sum_{q=max(j,k)}^{n} R_q$$

wherein the setting step includes a step of setting the current quantity $I_k$ based on a result obtained by measurement of currents flowing through the second wirings, and wherein the determining step includes a step of determining the signal applied to the second wirings based on the set value $V_j$.

2. A method of manufacturing an image display apparatus according to claim 1, wherein at least one of the set value $V_j$ at the j-th position, a set value $V_{j-1}$ at a (j−1)-th position, and a set value $V_{j-2}$ at a (j−2)-th position is set by the following expression $$V_j = V_{j-1} + \frac{R_{j-1}}{R_{j-2}}(V_{j-1} - V_{j-2}) + R_{j-1}I_{j-1}.$$

3. A method of manufacturing an image display apparatus including at least one first wiring, a plurality of image display devices connected to the first wiring, and a plurality of second wirings connected to the plurality of image display devices, comprising the steps of:

determining a signal applied to the second wirings; and applying a voltage to portions connected to the first wiring and the second wirings by application of a potential $D_L$ to a first predetermined position of the first wiring, application of a potential $D_R$ to a second predetermined position thereof, and application of the signal to the plurality of second wirings, wherein the determining step includes a step of setting a set value $V_j$ associated with a j-th position of a plurality of n positions, where j and n each are a positive integer, located between the first predetermined position and the second predetermined position on the first wiring, wherein in the setting step, the set value $V_j$ is set by the following expression $$V_j = D_L a_j + D_R b_j - \sum_{k=1}^{n} c_{j,k} I_k$$

where $I_k$ denotes a current quantity flowing from a k-th position of the n positions, wherein when N, where N is an integer and n≦N, subsidiary positions are set on the first wiring, the n positions correspond to $S_1$-th to $S_n$-th subsidiary positions, a resistance between adjacent subsidiary positions is a same value r, a resistance between a first subsidiary position and one of the first predetermined position and the second predetermined position which is closer to the first subsidiary position is $R_L$, a resistance between an n-th subsidiary position and one of the first predetermined position and the second predetermined position which is closer to the n-th subsidiary position is $R_R$, a resistance between both ends of the first wiring is $R_{all}$, min(j, k) indicates a minimum value between j and k, and max(j, k) indicates a maximum value between j and k, $a_j$, $b_j$, and $c_{j,k}$ are expressed by $$a_j = \frac{1}{R_{all}}\{R_R + (N - S_j)r\}$$

$$b_j = \frac{1}{R_{all}}\{R_L + (S_j - 1)r\}$$

$$c_{j,k} = \frac{1}{R_{all}}\{R_L + (S_{min(j,k)} - 1)r\}\{R_R + (N - S_{max(j,k)})r\}$$

wherein the setting step includes a step of setting the current quantity $I_k$ based on a result obtained by measurement of currents flowing through the second wirings, and wherein the determining step includes a step of determining the signal applied to the second wirings based on the set value $V_j$.

4. A method of manufacturing an image display apparatus according to claim 3, wherein at least one of the set value $V_j$ at the j-th position, a set value $V_{j-1}$ at a (j−1)-th position, and a set value $V_{j-2}$ at a (j−2)-th position is set by the following expression $$V_j = V_{j-1} + \frac{S_j - S_{j-1}}{S_{j-1} - S_{j-2}}(V_{j-1} - V_{j-2}) + (S_j - S_{j-1})rI_{j-1}.$$

5. A method of manufacturing an image display apparatus including at least one first wiring, a plurality of image display devices connected to the first wiring, and a plurality of second wirings connected to the plurality of image display devices, comprising the steps of:

determining a signal applied to the second wirings; and applying a voltage to portions connected to the first wiring and the second wirings by application of a potential $D_L$ to a first predetermined position of the first wiring, application of a potential $D_R$ to a second predetermined position thereof, and application of the signal to the plurality of second wirings, wherein the determining step includes a step of setting a set value $V_j$ associated with a j-th position of a plurality of n positions, where j and n each are a positive integer, located between the first predetermined position and the second predetermined position on the first wiring, wherein in the setting step, the set value $V_j$ is set by the following expression $$V_j = D_L a_j + D_R b_j - \sum_{k=1}^{n} c_{j,k} I_k$$

where $I_k$ denotes a current quantity flowing from a k-th position of the n positions, wherein when a resistance between adjacent positions on the first wiring is a same value r, a resistance between a first position and one of the first predetermined position and the second predetermined position which is closer to the first position is $R_L$, a resistance between an n-th position and one of the first predetermined position and the second predetermined position which is closer to the n-th position is $R_R$, and a resistance between both ends of the first wiring is $R_{all}$, $a_j$, $b_j$, and $c_{j,k}$ are expressed by $$a_j = \frac{1}{R_{all}}\{R_R + (n-j)r\}$$

$$b_j = \frac{1}{R_{all}}\{R_L + (j-1)r\}$$

$$c_{j,k} = \frac{1}{R_{all}}\{R_L + (\min(j,k)-1)r\}\{R_R + (n-\max(j,k))r\}$$

wherein the setting step includes a step of setting the current quantity $I_k$ based on a result obtained by measurement of currents flowing through the second wirings, and wherein the determining step includes a step of determining the signal applied to the second wirings based on the set value $V_j$.

6. A method of manufacturing an image display apparatus according to claim 5, wherein at least one of the set value $V_j$ at the j-th position, a set value $V_{j-1}$ at a (j−1)-th position, and a set value $V_{j-2}$ at a (j−2)-th position is set by the following expression $$V_j=2V_{j-1}-V_{j-2}+rI_{j-1}.$$

7. A method of manufacturing an image display apparatus including at least one first wiring, a plurality of image display devices connected to the first wiring, and a plurality of second wirings connected to the plurality of image display devices, comprising the steps of:

determining a signal applied to the second wirings; and applying a voltage to portions connected to the first wiring and the second wirings by application of a potential D to a first predetermined position of the first wiring, setting of an open state of an end portion of the first wiring which is separated from the first predetermined position, and application of the signal to the plurality of second wirings, wherein the determining step includes a step of setting a set value $V_j$ associated with a j-th position of a plurality of n positions, where j and n each are a positive integer, located between the first predetermined position and the end portion on the first wiring, wherein position numbers of the n positions, where n is positive integer, on the first wiring, which are counted from the first predetermined position to the end portion are 1, 2, . . . , n, a current value in the case where a sign of a direction of a current flowing from the j-th position is positive is $I_j$, a resistance between the j-th position and the (j+1)-th position is $R_j$, in the case where a resistance between the first position and the first predetermined position is $R_0$, $$I_{rem1} = \sum_{k=1}^{n} I_k$$

$$V_1 = D - a_0 I_{rem1}$$

$$a_j = R_j$$

-continued $$I_{remj} = I_{remj-1} - I_{j-1}i$$

the set value $V_j$ associated with the j-th position is set by the following expression $$V_j=V_{j-1}-a_{j-1}I_{remj}$$

where j is 2, 3, . . . , n−1, wherein the setting step includes a step of setting the current quantity $I_k$ based on a result obtained by measurement of currents flowing through the second wirings, and wherein the determining step includes a step of determining the signal applied to the second wirings based on the set value $V_j$.

8. A method of manufacturing an image display apparatus including at least one first wiring, a plurality of image display devices connected to the first wiring, and a plurality of second wirings connected to the plurality of image display devices, comprising the steps of:

determining a signal applied to the second wirings; and applying a voltage to portions connected to the first wiring and the second wirings by application of a potential D to a first predetermined position of the first wiring, setting of an open state of an end portion of the first wiring which is separated from the first predetermined position, and application of the signal to the plurality of second wirings, wherein the determining step includes a step of setting a set value $V_j$ associated with a j-th position of a plurality of n positions, where j and n each are a positive integer, located between the first predetermined position and the end portion on the first wiring, wherein position numbers of the n positions (where n is positive integer) on the first wiring, which are counted from the first predetermined position to the end portion are 1, 2, . . . , n, a current value in the case where a sign of a direction of a current flowing from the j-th position is positive is $I_j$, N, where N is an integer and $n \leqq N$, subsidiary positions are set on the first wiring, the n positions correspond to $S_1$-th to $S_n$-th subsidiary positions, a resistance between adjacent subsidiary positions is a same value r, a resistance between a first subsidiary position and the first predetermined position is $R_L$, and when $$I_{rem1} = \sum_{k=1}^{n} I_k$$

$$V_1 = D - a_0 I_{rem1}$$

$$a_0 = R_L + (S_1 - 1)r$$

$$a_j = (S_{j+1} - S_j)r$$

$$I_{remj} = I_{remj-1} - I_{j-1}i$$

the set value $V_j$ associated with the j-th position is set by the following expression $$V_j=V_{j-1}-a_{j-1}I_{remj}$$

where j is 2, 3, . . . , n−1, wherein the setting step includes a step of setting the current quantity $I_k$ based on a result obtained by measurement of currents flowing through the second wirings, and wherein the determining step includes a step of determining the signal applied to the second wirings based on the set value $V_j$.

9. A method of manufacturing an image display apparatus including at least one first wiring, a plurality of image display devices connected to the first wiring, and a plurality of second wirings connected to the plurality of image display devices, comprising the steps of:

determining a signal applied to the second wirings; and applying a voltage to portions connected to the first wiring and the second wirings by application of a potential D to a first predetermined position of the first wiring, setting of an open state of an end portion of the first wiring which is separated from the first predetermined position, and application of the signal to the plurality of second wirings, wherein the determining step includes a step of setting a set value $V_j$ associated with a j-th position of a plurality of n positions (where j and n each are a positive integer) located between the first predetermined position and the end portion on the first wiring, wherein position numbers of the n positions, where n is positive integer, on the first wiring, which are counted from the first predetermined position to the end portion are 1, 2, . . . , n, a current value in the case where a sign of a direction of a current flowing from the j-th position is positive is $I_j$, a resistance between adjacent positions of the first wiring is a same value r, a resistance between a first position and the first predetermined position is $R_L$, and when $$I_{rem1} = \sum_{k=1}^{n} I_k$$

$$V_1 = D - a_0 I_{rem1}$$

$$a_0 = R_L$$

$$a_j = r$$

$$I_{remj} = I_{remj-1} - I_{j-1} i$$

the set value $V_j$ associated with the j-th position is set by the following expression $$V_j = V_{j-1} - a_{j-1} I_{remj}$$

where j is 2, 3, . . . , n−1 wherein the setting step includes a step of setting the current quantity $I_k$ based on a result obtained by measurement of currents flowing through the second wirings, and wherein the determining step includes a step of determining the signal applied to the second wirings based on the set value $V_j$.

10. A method of manufacturing an image display apparatus according to claim 1, wherein each of the n positions on the first wiring is set to be included in each of groups G1 to Gm of where m is an integer smaller than n, a representative position of position coordinates in each of the groups is expressed by one of P1 to Pm, a sum of currents flowing from the positions included in each of the groups is set as one of representative position currents I1 to Im flowing from the representative positions P1 to Pm, and representative set values V1 to Vm associated with the groups are set by the step of setting the set value $V_j$.

11. A method of manufacturing an image display apparatus according to claims 10, wherein potentials at positions other than the representative positions are obtained by polynomial interpolation based on potentials at the representative positions P1 to Pm included in the groups G1 to Gm of m and a potential applied to the first wiring.

12. A method of manufacturing an image display apparatus according to claim 1, wherein the n positions are set corresponding to intersections between the first wiring and the plurality of second wirings.

13. A method of manufacturing an image display apparatus according to claim 1, wherein the image display apparatus comprises a plurality of first wirings and performs the determining step and applying step for each of the first wirings.

14. A method of manufacturing an image display apparatus according to claim 1, further comprising the step of setting a potential to a plurality of positions on the second wirings wherein the signal applied to the second wiring set by the setting step and the set value $V_j$.

15. A method of manufacturing an image display apparatus according to claims 14, wherein portions to which the voltage is applied are connected between a plurality of positions on each of the first wirings and the plurality of positions on the second wirings.

16. A method of manufacturing an image display apparatus according to claims 15, wherein when each of the first wirings is a row wiring, each of the second wirings is a column wiring, a potential on a row wiring at a position of i-th row and j-th column is $Y_{i,j}$, a potential on a column wiring at the position of i-th row and j-th column is $X_{i,j}$, a current flowing from a row wiring side to a column wiring side at the position of i-th row and j-th column is $I_{i,j}$, and a resistance value of a resistor which is provided in series with a portion between the row wiring and the column wiring at the position of i-th row and j-th column is $R_{i,j}$, a voltage $V_{i,j}$ applied to the portion is set by the following expression $$V_{i,j} = Y_{i,j} - X_{i,j} - R_{i,j} I_{i,j}$$

where i and j each are a positive integer.

* * * * *